(12) United States Patent
Usui et al.

(10) Patent No.: US 8,012,362 B2
(45) Date of Patent: Sep. 6, 2011

(54) ELECTROMAGNETIC SHIELDING LIGHT-TRANSMITTING MEMBER AND METHOD FOR MANUFACTURING SAME

(75) Inventors: Shinichi Usui, Tokyo (JP); Yukihiro Ueda, Tokyo (JP); Toshinori Machida, Tokyo (JP); Naotoshi Nakamura, Tokyo (JP); Shigemoto Kato, Tokyo (JP); Kazuhito Tokutome, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 739 days.

(21) Appl. No.: 11/921,314

(22) PCT Filed: Jun. 1, 2006

(86) PCT No.: PCT/JP2006/311015
§ 371 (c)(1),
(2), (4) Date: Nov. 30, 2007

(87) PCT Pub. No.: WO2006/129765
PCT Pub. Date: Dec. 7, 2006

(65) Prior Publication Data
US 2009/0206754 A1    Aug. 20, 2009

(30) Foreign Application Priority Data
Jun. 2, 2005    (JP) ................. 2005-163287
Mar. 15, 2006    (JP) ................. 2006-070426

(51) Int. Cl.
*B29D 11/00* (2006.01)
*B44C 1/22* (2006.01)

(52) U.S. Cl. ................. 216/24; 216/33; 216/34

(58) Field of Classification Search ............ 216/24, 216/33, 34
See application file for complete search history.

(56) References Cited

U.S. PATENT DOCUMENTS
2002/0086138 A1* 7/2002 Iijima ................. 428/141
2005/0121213 A1* 6/2005 Arakawa et al. ........ 174/35 MS

FOREIGN PATENT DOCUMENTS

| JP | 10-335885 | 12/1998 |
|---|---|---|
| JP | 2000-315889 | 11/2000 |
| JP | 2000-323890 | 11/2000 |
| JP | 2000-323891 | 11/2000 |
| JP | 2002-164691 | 6/2002 |
| JP | 2003-92490 | 3/2003 |
| JP | 2003-188576 | 7/2003 |
| JP | 2003-218583 | 7/2003 |
| JP | 3480898 | 10/2003 |
| JP | 2004-14538 | 1/2004 |
| JP | 2004-69931 | 3/2004 |

OTHER PUBLICATIONS

Machine English Translation of JP 2004-165237.*
Machine English Translation of JP 2001-247827.*

* cited by examiner

*Primary Examiner* — Shamim Ahmed
(74) *Attorney, Agent, or Firm* — McDermott Will & Emery LLP

(57) ABSTRACT

Disclosed is an electronic shielding light-transmitting member having an adhesive (2) and an electromagnetic shielding material (3) between two release films (1) and (4). By removing one of the release films (1) and (4) from the electronic shielding light-transmitting member and bonding the member to an optical filter or a plasma panel, there can be obtained an optical filter or a plasma panel having an electromagnetic shielding layer of excellent transparency.

2 Claims, 3 Drawing Sheets (a)

(b)

(a)

(b)

ELECTROMAGNETIC SHIELDING LIGHT-TRANSMITTING MEMBER AND METHOD FOR MANUFACTURING SAME

RELATED APPLICATIONS

This application is the U.S. National Phase under 35 U.S.C. §371 of International Application No. PCT/JP2006/311015, filed on Jun. 1, 2006, which in turn claims the benefit of Japanese Application No. 2005-163287, filed on Jun. 2, 2005 and Japanese Application No. 2006-070426, filed on Mar. 15, 2006, the disclosures of which Applications are incorporated by reference herein.

TECHNICAL FIELD

The present invention relates to an electromagnetic shielding light-transmitting member, a method for manufacturing the member, an optical filter using the member, and a display panel such as a plasma display panel formed by using the member.

BACKGROUND ART

In various displays such as plasma display and EL display that have prevailed in recent years, and CRT, there has been a problem that an electromagnetic wave (a microwave) is generated from a display and the electromagnetic wave has a harmful influence on other devices. There is also a problem that the microwave may have a harmful influence on the human body. In particular, concerning the plasma display, it is a problem because a stronger electromagnetic wave compared with other displays is generated and leaks since the plasma display panel is driven a thigh-voltage. In order to shield the electromagnetic wave leaking from the front face of these various displays, the space may be insulated electromagnetically. With such an object, it is conventionally proposed and carried out to mount an electromagnetic wave shielding structure having both an electromagnetic wave shielding property and transparency on the front face of the various displays and connect the electromagnetic wave shielding structure with an outer electrode in order to ground it (for example, refer to Patent Documents 1 to 4 below). Further, a problem occurs that a near-infrared ray based on inert gas enclosed in a light emitting cell is generated from the plasma display panel and this near-infrared ray causes a false operation of an electric device such as a cordless phone and a remote controller.

By way of example, the electromagnetic wave shielding structure is formed by layering an electromagnetic wave shielding film with a plastic plate that is a transparent base material, and press-fitting or heating and press-fitting them to adhere the electromagnetic wave shielding film to the plastic plate. The electromagnetic wave shielding film is configured with a plastic film, an adhesive layer provided on the plastic film, and an electromagnetic wave shielding layer having a mesh-like electromagnetic wave shielding material with a geometric shape formed by chemically etching a metal foil made of a conductive material adhered to the adhesive layer. Further, a conductive frame part electrically connected with the geometric shape is formed on the outer periphery of the geometric shape. However, the mesh-like electromagnetic wave shielding layer with the geometric shape and the conductive frame part are formed by attaching a metal foil to the adhesive layer and etching the metal foil through a chemical etching process. Because an electrolytic copper foil with a backside face roughened is normally used as the metal foil, the roughened shape of the electrolytic copper foil is transferred onto the surface of the adhesive, and a part of the surface of the adhesive from which the copper foil has been removed by etching becomes a roughened face. On the other hand, a layer that flows by heating or pressurizing is used as the adhesive layer. As described above, the electromagnetic shielding film is press-fitted or heated and press-fitted to allow the adhesive to be fluidized, the fluidized adhesive flows into the space of the mesh-like electromagnetic wave shielding film, and consequently adheres to the plastic plate, so that the electromagnetic wave shielding film is adhered to the plastic substrate.

A conventional electromagnetic shielding film is manufactured by chemically etching a metal foil after attaching the metal foil whose pasting face to an adhesive layer is roughened with the adhesive layer. Such a conventional electromagnetic shielding film has a problem in visibility, i.e., the clearness of an image because an uneven face shape of the roughened metal is transferred to the adhesive layer and an image is seen through the uneven adhesive layer.

In order to overcome this problem, Japanese Patent No. 3480898 proposes an electromagnetic shielding film for display in which an adhesive layer having an uneven face of roughened metal transferred thereto is made to be transparent. Specifically, an electromagnetic shielding film which is made to be transparent is attempted in such a manner that a transparent layer is adhered by heating or pressurizing to an adhesive layer having an uneven face of roughened metal transferred thereto and the uneven face of the adhesive layer is damped with the transparent layer.

Patent Document 1: Japanese Patent Application Laid-Open (JP-A) No. 10-335885
Patent Document 2: Japanese Patent No. 3480898
Patent Document 3: JP-A-2000-323890
Patent Document 4: JP-A-2000-323891

DISCLOSURE OF THE INVENTION

Problems to be Solved by the Invention

In the electromagnetic shielding film for display disclosed in Japanese Patent No. 3480898, a small amount of air easily remains in the uneven face of the adhesive layer, and the part where air remains becomes a defective part of the display. Further, even when the transparent layer is adhered by heating or pressurizing, in the case of providing a transparent layer having a refractive index different from that of the adhesive layer, the transparency becomes a little low since the transparent layer does not become completely transparent. Furthermore, because the geometric shape of the electromagnetic wave shielding layer (herein after, referred to as a mesh) is formed by etching the metal layer, the plastic film adhering to the metal layer through the adhesive layer is exposed to various liquid chemicals such as an etchant, and it passes through various rolls such as a conveying roll in the manufacturing line. With this, deterioration due to the liquid chemicals and fine scratches due to the conveying roll, etc. is generated in the plastic film. By such reasons, there is a problem that transparency and smoothness deteriorate and the quality of the display also deteriorates.

In order to increase contrast of the display, the surface of the metal layer of the metal foil or the metal mesh is preferably subjected to a blackening treatment. As a method of blackening treatment, especially a copper foil blackening treatment, a method generally employed in the field of printed wiring boards is normally adapted. An oxide film is formed on the surface of the metal layer with the blackening treatment, and at the same time, a very fine needle-like crystal is also produced. When the needle-like crystal attaches to a part to be etched of the electromagnetic wave shielding layer (an opening part of the metal layer other than the mesh part), it allows the quality of the display to deteriorate, it becomes a defect, and the yield decreases. Occurrence of defects due to the scratching of the plastic film described above and decrease of the yield due to the attachment of foreign matters such as a needle-like crystal may lead to high manufacturing cost of the product and inferior economic efficiency.

Therefore, an object of the present invention is to provide an electromagnetic wave shielding light-transmitting member in which an electromagnetic wave shielding layer of excellent transparency without having the problems as described above, that is without scratching and without attachment of foreign matters to the electromagnetic wave shielding layer even if a metal mesh is blackened, can be formed in an optical filter and a display panel.

An other object of the present invention is to provide an optical filter or a display panel such as a plasma display panel, which is formed by use of the electromagnetic wave shielding light-transmitting member excellent in the characteristics.

Still another object of the present invention is to provide a method for manufacturing an electromagnetic wave shielding light-transmitting member which enables formation of an optical filter and a display panel having an electromagnetic wave shielding layer that has excellent transparency without scratching and the attachment of foreign matters.

Means of Solving the Problems

The present invention relates to an electromagnetic wave shielding light-transmitting member, an optical filter, a display panel such as a plasma display panel, and a method for manufacturing the electromagnetic wave shielding light-transmitting member, which have constructions described below to solve the above problems.

That is, (i) the present invention relates to an electromagnetic wave shielding light-transmitting member, containing an adhesive and an electromagnetic wave shielding material between two release films.

(ii) The present invention relates to the electromagnetic wave shielding light-transmitting member, wherein the electromagnetic wave shielding material described above is covered with an adhesive.

(iii) The present invention relates to the electromagnetic wave shielding light-transmitting member described in the item (i), wherein at least a part of the wave shielding material is exposed from the adhesive.

(iv) The present invention relates to the electromagnetic wave shielding light-transmitting member, wherein the above-described adhesive is an adhesive of an active energy ray curing type.

(v) The present invention relates to the electromagnetic wave shielding light-transmitting member, wherein the above-described adhesive contains a near-infrared ray absorbing substance or a color correction material.

(vi) The present invention relates to an optical filter made by peeling off at least one release film from the electromagnetic wave shielding light-transmitting member and pasting the exposed adhesive thereof on a transparent base material.

(vii) The present invention relates to the above-described optical filter, wherein the transparent base material includes one or more layers selected from an antireflection layer, a hard coat layer, an antidazzle functioning layer, a color tone correcting layer, and a near-infrared ray absorbing layer.

(viii) The present invention relates to the optical filter described in the item (vi), wherein one or more layers selected from an antireflection layer, an hard coat layer, an antidazzle functioning layer, a color tone correcting layer, and a near-infrared ray absorbing layer are formed on a transparent base material.

(ix) The present invention relates to the above-described optical filter, which is for a plasma display panel.

(x) The present invention relates to a plasma display panel formed by peeling off at least one release film from the electromagnetic wave shielding light-transmitting member described in any one of the items (1) to (5) above and pasting the exposed adhesive thereof to the plasma display panel.

(xi) The present invention relates to a plasma display panel, in which the optical filter described in any one of the items (6) to (8), is installed.

(xii) The present invention relates to a method for manufacturing an electromagnetic wave shielding light-transmitting member, in which steps (1) to (7) described below are conducted in an arbitrary order and irradiation with an active energy ray is conducted at least one time:

(1) a step of pasting a metal foil and a base material film through an adhesive of active energy ray adhesive force vanishing type;

(2) a step of forming a metal mesh by selectively etching the metal foil;

(3) a step of performing a blackening treatment on the surface of the metal foil or metal mesh;

(4) a step of pasting the metal mesh face of a laminated body including the base material film, the adhesive of active energy ray adhesive force vanishing type, and the metal mesh to a support for transfer through an adhesive;

(5) a step of peeling off the base material film from the metal mesh;

(6a) a step of pasting an exposed part of the metal mesh generated by peeling off the base material film from the metal mesh to a new release film; and (7) a step of burying the metal mesh into the adhesive.

(xiii) The present invention relates to a method for manufacturing an electromagnetic wave shielding light-transmitting member, in which steps (1) to (7) described below are performed in an arbitrary order and irradiation with an active energy ray is performed at least one time:

(1) a step of pasting a metal foil and a base material film through an adhesive of active energy ray adhesive force vanishing type;

(2) a step of forming a metal mesh by selectively etching the metal foil;

(3) a step of conducting a blackening treatment on the surface of the metal foil or metal mesh;

(4) a step of pasting the metal mesh face of a laminated body including the base material film, the adhesive of active energy ray adhesive force vanishing type, and the metal mesh to a support for transfer through an adhesive;

(5) a step of peeling off the base material film from the metal mesh;

(6b) a step of pasting an exposed part of the metal mesh generated by peeling off the base material film from the metal mesh to the adhesive face of a new laminated body obtained by applying an adhesive on a release film; and (7) a step of burying the metal mesh into the adhesive.

Effect of the Invention

In the invention, scratching and foreign matters do not remain in an electromagnetic wave shielding light-transmitting member or an electromagnetic wave shielding layer obtained. This is because a base material film and an adhesive of active energy ray adhesive force vanishing type are finally removed in the process of manufacturing an electromagnetic wave shielding light-transmitting member even when scratching is created in the base material film, foreign matters are attached to the adhesive of active energy ray adhesive force vanishing type, and characteristics of the adhesive layer deteriorate by the etchant. For this reason, problems when an electromagnetic shielding structural body is manufactured, that have not been solved conventionally, can be solved, the problems including occurrence of scratching on the electromagnetic wave shielding film, display defects caused by the attachment of very fine crystals due to the blackening treatment, and transparency decrease of the adhesive in the etching process. Thus, an electromagnetic wave shielding layer of excellent quality without deterioration of transparency can be formed. Because the product yield is improved in the invention, there is also an effect that it is economically efficient. Further, use of the electromagnetic wave shielding light-transmitting member of the invention makes it possible to form an electromagnetic shielding layer without needing other layers such as a plastic film necessary so far when the electromagnetic wave shielding layer is provided. Consequently, it is possible to form a optical filter and a display panel such as a plasma display, which have an electromagnetic shielding function, with a thin thickness that cannot be obtained with the conventional method.

EXPLANATION OF REFERENCE NUMERALS

Figure 1:
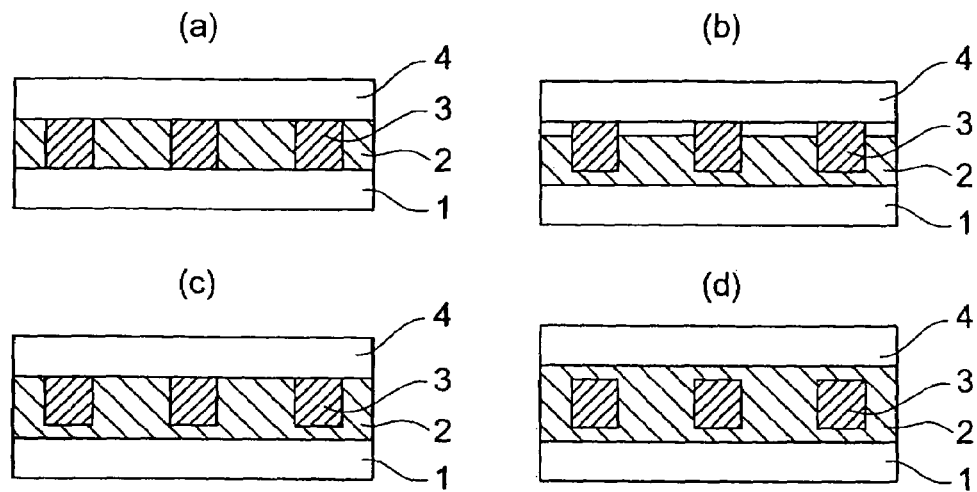
FIGS. 1(a) to 1(d) are sectional views showing various modes of an electromagnetic wave shielding light-transmitting member according to the present invention.

In FIGS. 1 to 9, reference numerals 1, 4, 6, and 8 each denote a release film; 2 denotes an adhesive; 3 denotes an electromagnetic wave shielding material; 5 denotes a transparent base material of an optical filter; 7 denotes a laminated body; 9 denotes a transfer sheet; 10 denotes a mesh forming sheet; 11 denotes a base material film; 12 denotes an adhesive of active energy ray adhesive force vanishing type; 13 denotes a metal foil; and 15 denotes a mesh forming sheet having the metal mesh formed therein.

BEST MODE FOR CARRYING OUT THE INVENTION

Hereinafter, an electromagnetic wave shielding light-transmitting member of the present invention will be explained with reference to FIG. 1. In the figure, the size and the thickness of each member and layer is not shown in an accurate scale because the figures are aimed to explain the present invention.

The electromagnetic wave shielding light-transmitting member of the invention contains an adhesive 2 and an electromagnetic wave shielding material 3 between two release films 1 and 4. FIG. 1 shows several modes of the electromagnetic wave shielding light-transmitting member of the invention. FIG. 1(a) is an example in which the adhesive 2 and the electromagnetic wave shielding material 3 are in a state in which both sides of the electromagnetic wave shielding material 3 closely contact with the release films 1 and 4. FIG. 1(b) is an example in which only one face of the adhesive 2 closely contacts with the release films 1 although both sides of the electromagnetic wave shielding material closely contact with the release films 1 and 4. FIG. 1(c) is an example in which only one side of the electromagnetic wave shielding material 3 closely contacts with the release film 3, and the entire face of the adhesive 2 is closely contacted with the release film 1 on one face and the electromagnetic wave shielding material and the adhesive closely contact with the release film 4 on the other face. FIG. 1(d) is an example in which the entire face of the adhesive 2 closely contacts with the release films 1 and 4 in both sides while the electromagnetic shielding material 3 is in the adhesive and does not contact with the release films 1 and 4. In the electromagnetic shielding light-transmitting member of the invention, the adhesive 2 and the electromagnetic shielding material 3 may be contained between two release films 1 and 4, and it is not limited to the modes.

The release films 1 and 4 constituting the electromagnetic wave shielding light-transmitting member of the invention are films obtained by applying a releasing treatment with a releasing material such as silicon and fluorine onto a plastic film. Application of the releasing treatment enables the film to be simply and easily peeled off with an arbitrary method even in the case of pasting the release film on a base material etc. through an adhesive. The release film used is distinguished from a simple transparent plastic film etc. A commercially available release film can be also used as the release film, and its example includes E7002 manufactured by Toyobo Co., Ltd. and Removable Film NT manufactured by Panac Corporation. Further, a film obtained by applying an adhesive of active energy ray adhesive force vanishing type described later on a base material film such as a plastic film can be used as the release film. However, from the economical reason and the viewpoint of a handling property, a film obtained by applying a known releasing treatment on a plastic film with silicon compound, fluorine compound, or the like is preferably used.

The plastic film is preferably one having flexibility and further having transmittance to an active energy ray. A thickness of the plastic film may be arbitrary, and it is preferably about 5 to 500 μm, and more preferably 10 to 200 μm. Specific examples of the plastic film include films of polyesters such as polyethylene terephthalate (PET) and polyethylene naphthalate (PEN), polyolefins such as polyethylene, polypropylene, polystyrene, and an ethylene/vinyl acetate copolymer (EVA), vinyl polymers such as polyvinyl chloride and polyvinylidene chloride, polysulphone, polyether sulphone, polyphenylene sulfide, polycarbonate, polyamide, polyimide, an acrylic resin, and a cycloolefin resin. The plastic film may be a laminated film, and examples of resins forming a laminated body are resins constituting the single layer plastic film as described above. A PET film is preferably used as the plastic film from the aspect of cost and handling property. These plastic films can be used as the base material film of the invention described later.

The electromagnetic wave shielding light-transmitting member of the invention contains the adhesive 2 and the electromagnetic wave shielding material 3 between the two release films 1 and 4. For example, in the case of arranging the faces of the two release films subjected to the releasing treatment in the laminating direction, the adhesive and the electromagnetic wave shielding material are contained between the two faces subjected to the releasing treatment. The positional relationship of the two faces subjected to the releasing treatment may be parallel or may not be parallel. Moreover, the positional relationship of the two faces subjected to the releasing treatment is preferably parallel.

In the invention, the base material film that is a temporary support is used when manufacturing the electromagnetic wave shielding material, and the temporary support is peeled off and removed from the electromagnetic shielding material in the process of manufacturing the electromagnetic wave shielding light-transmitting member. Thus, the temporary support does not exist in the electromagnetic wave shielding light-transmitting member finally obtained. Because of this, even in the case that scratches are formed on the base material film used as the temporary support of the shielding material in the process of manufacturing the shielding material, the formed scratches do not affect the electromagnetic wave shielding light-transmitting member, and light-transmission (transparency) of the shielding layer can be improved. Further, compared with the conventional electromagnetic wave shielding structure, economic efficiency is good because at least one layer of the plastic film can be omitted, and it contributes to making the thickness of the display front face filter, the electromagnetic wave shielding building materials, etc. thinner. In the case of not using the release film on both faces of the electromagnetic wave shielding light-transmitting member, scratches are formed on the base material film in the manufacturing process, and foreign matters attach on the mesh opening part, so that transparency deteriorates and the member is not in a good condition for sale. Further, damage of the base material film and adhesive due to an etchant used when the electromagnetic wave shielding material is formed also becomes a problem.

The electromagnetic wave shielding material 3 of the invention is a geometric shaped mesh-like conductive metal material or a similar metal material. The electromagnetic wave shielding material can be prepared by forming a resist pattern on a conductive metal foil by use of a micro-lithography method or a printing method, and then applying an etching treatment by chemical etching etc., or alternatively, for example, with a plating method or a printing method using a electrically conductive ink.

Examples of the conductive metal foil include foils of metals such as copper, aluminum, nickel, iron, gold, silver, chromium, and titanium, and alloys of two or more kinds of these metals. Among these, the foils of copper, nickel, aluminum, and alloys of these metals are preferable from the aspects of conductivity, ease of circuit processing and costs, and copper and a copper alloy are more preferable. Further, a conductive metal foil may be one subjected to a blackening treatment in advance by a known method.

The thickness of the metal foil is preferably 0.5 to 40 µm, and more preferably 1 to 30 µm. The thickness exceeding 40 µm is not preferable because not only formation of fine lines becomes difficult but also a view angle becomes narrow when the electromagnetic wave shielding material is applied in the front face of a display such as a plasma display. Further, surface resistance becomes large when the thickness is less than 0.5 µm, and the electromagnetic wave shielding effect tends to deteriorate.

Examples of the shape of the mesh include triangles such as an equilateral triangle, an isosceles triangle, and a right-angled triangle, quadrangles such as a square, a rectangular, a rhombus, a parallelogram, and a trapezoid, n-sided polygons (n is a positive number) such as a hexagon, an octagon, a dodecagon, and an icosagon, a circle, an oval, and a star. The shape of the mesh consists of one kind or combination of two or more kinds of the unit shapes described above. For the unit shape constituting the mesh, a triangle is the most effective from the viewpoint of electromagnetic shielding property. Further, the n-sided polygons with a large n are preferred from the viewpoint of visible light transmittance. It is desirable to provide a conductive frame part that is electrically connected with the mesh on the outer periphery of the mesh.

The width of lines constructing the mesh is preferably in the range of 40 µm or less, the space between the lines is preferably in the range of 100 µm or more, and the thickness of the lines is preferably in the range of 40 µm or less. The line width is more preferably 25 µm or less from the viewpoint of non-visibility of the mesh, the line spacing is more preferably 120 µm or more from the viewpoint of visible light transmittance, and the line thickness is more preferably 18 µm or less. The line width is preferably 40 µm or less, especially preferably 25 µm or less, and it is preferably 1 µm or more because the surface resistance becomes too large and the shielding effect deteriorates when it becomes too small and narrow. The line thickness is preferably 40 µm or less. Further it is preferably 0.5 µm or more, and more preferably 1 µm or more because the surface resistance becomes too large and the shielding effect deteriorates when the thickness is too small. As the apace between the lines increases, the opening rate is improved and the visible light transmittance is also improved. When the electromagnetic wave shielding material is used in the display front face as described above, the opening rate of the mesh is preferably 50% or more, more preferably 60% or more, and further more preferably 80% or more. Because the electromagnetic wave shielding property deteriorates when the space between the lines becomes too large, the space between the lines is preferably 1,000 µm (1 mm) or less. In this place the opening rate is percentage as a ratio of an area, wherein a metal mesh area is subtracted from an effective area covered with an electromagnetic wave shielding material, to the effective area.

A method of forming the mesh on the metal foil using a micro-lithography method is preferable from the aspects of process accuracy and process efficiency as a method of forming the mesh using a conductive metal foil. Examples of the micro-lithography method include a photolithography method, an x-ray lithography method, an electron beam lithography method, and an ion beam lithography method. Among these, the photolithography method is the most efficient from the viewpoints of its simplicity and ease of mass production. In particular, a photolithography method using chemical etching is the most preferable from the viewpoints of its simplicity and ease, economic efficiency, process accuracy of the metal mesh, etc. In the micro-lithography method, sequentially performed are: formation of a resist pattern by formation of a resist layer on the metal foil, light exposure, and developing; etching of the metal foil using the resist pattern; peeling off of the resist layer; and a neutralization process if necessary. If there is a necessity to further subject to a blackening treatment onto the etched metal foil face, the blackening treatment is then conducted. The resist pattern can be produced by printing a resist ink using a printing method such as a screen printing method and a relief offset printing method without passing through the light exposure and developing step.

Any etching methods conventionally known may be used for etching the metal foil at the mesh formation. Chemical etching using an etchant is a preferable method from the economical aspect. An example of the etchant is an aqueous solution of iron chloride, copper chloride, etc. Further, a resist stripping liquid is preferably an aqueous caustic soda solution. For the neutralization, an acid solution of hydrochloric acid, sulfuric acid, oxalic acid and the like is preferable. A known blackening treatment liquid used in printed circuit board manufacturing technology is preferably used as the blackening treatment liquid of the invention. Various liquid chemicals for these etchants etc. and use conditions thereof are not particularly limited, and any liquid chemical and use condition known in the method of manufacturing a printed circuit board can be used.

Preferable examples of the adhesive constituting the electromagnetic wave shielding light-transmitting member of the invention include an adhesive comprising of an acrylic polymer having at least one kind of reactive functional group consisting of a carboxyl group, a hydroxyl group, an amide group, a glycidyl group, an amino group, and an acetoacetoxy group in a molecule, and a curing agent that can react with the above-described reactive functional group.

Typical examples of the acrylic polymer include (A) a copolymer of a monomer having a reactive functional group and another (meth)acrylic ester monomer and (B) a copolymer of a monomer having a reactive functional group, another (meth) acrylic ester monomer, and another vinyl monomer that is copolymerizable with the monomer. These acrylic polymers are synthesized by a known method. In order to impart adhesiveness, a glass transition point of the acrylic polymer is preferably −20° C. or less. A weight average molecular weight of the acrylic polymer is preferably 200,000 to 2,000,000, and more preferably 400,000 to 1,500,000 in terms of the balance between adhesive force and cohesive force. Examples of the monomer that can be used to manufacture the acrylic polymer are given below, but not limited thereto. Any known monomer conventionally used to manufacture a acrylic polymer can be used. Moreover, the weight average molecular weight of the polymer is measured using a calibration curve by standard polystyrenes with gel permeation chromatography.

Examples of the monomer having a reactive functional group that can be used to manufacture the acrylic polymer include acrylic acid, methacrylic acid, itaconic acid, 2-hydroxyethyl acrylate, 2-hydroxyethylmethacrylate, 4-hydroxybutylacrylate, 2-acetoacetoxyethyl methacrylate, acrylamide, glycidyl methacrylate, and 2-methacryloyloxyethyl isocyanate.

Examples of the another (meth)acrylic ester monomer include methyl acrylate, methyl methacrylate, ethyl acrylate, ethyl methacrylate, butyl acrylate, butyl methacrylate, isobutyl acrylate, isobutyl methacrylate, isopropyl acrylate, 2-ethylhexyl acrylate, 2-ethylhexyl methacrylate, lauryl acrylate, dimethylaminomethyl methacrylate, and dimethlaminoethyl methacrylate.

Further, examples of the another vinyl monomer that is copolymerizable with the monomer having the reactive functional group and another (meth)acrylic ester monomer include vinyl acetate, styrene, α-methylstyrene, acrylonitrile, and vinyltoluene.

On the other hand, the curing agent imparts a cohesive force to the adhesive by reacting with the acrylic polymer having a reactive functional group, and available examples of the curing agent include a known multi-functional compound having reactivity with the reactive functional group, such as a isocyanate compound, an epoxy compound, and an aziridinyl compound. The amount of the curing agent to be used may be determined by considering the types and the adhesive force of the acrylic monomer, and is not particularly limited. However, the curing agent is preferably added in 0.1 to 15 parts by weight, and more preferably 0.1 to 10 parts by weight with respect to 100 parts by weight of an acrylic resin. The amount of less than 0.1 parts by weight is not preferable because the degree of crosslinking decreases and the cohesive force become insufficient. The amount exceeding 15 parts by weight is not preferable because the adhesive force to the adherend tends to become small.

Examples of the isocyanate compound include diisocyanate such as tolylene diisocyanate, isophoron diisocyanate, hexamethylene diisocyanate, m-phenylene diisocyanate, and xylylene diisocyanate, a trimethylolpropane adduct of these compounds, a buret compound of these compounds reacted with water, and a trimer having an isocyanurate ring.

Examples of the epoxy compound include sorbital polyglycidyl ether, polyglycerol polyglycidyl ether, pentaerythritol polyglycidyl ether, diglycerol polyglycidyl ether, glycerol polyglycidyl ether, neopentyl glycol diglycidyl ether, resorcine diglycidyl ether, metaxylene diamine tetraglycidyl ether, and their hydrogenated products.

Examples of the aziridinyl compound include N,N'-diphenylmetane-4,4-bis(1-aziridine carboxyamide), trimethylolpropane-tri-β-aziridinyl propionate, tetramethylolmethane-tri-β-aziridinyl propionate, and N,N'-toluene-2,4-bis(1-aziridine carboxyamide)triethylene melamine.

The adhesive may include various known additives such as an adhesion-imparting agent, a plasticizer, a thickener, an antioxidant, an ultra violet absorber, an infrared-absorbing material, a wetting agent, a filler, a pigment, a dye, a diluent, a rust preventive agent, and a curing accelerator. Only one type of these additives may be used, or two or more kinds may be appropriately used. The amount of these additives to be added may be an amount that enables the objective physical properties to be obtained, and it is not particularly limited.

An adhesive of active energy ray curing type may be preferably used as the adhesive other than the above-described adhesives. The adhesive of active energy ray curing type is an adhesive by which an adhesive force appears when curing (three-dimensional crosslinking) occurs by irradiation with an active energy ray, and the cohesion force increases. In the invention, an adhesive of active energy ray curing type comprising an acrylic polymer, an active energy ray reactive compound, a photopolymerization initiator, a polymerization inhibitor, and other additives is preferably used.

The adhesive of active energy ray curing type is different from ordinary adhesives and contains no curing agent, or even if it contains a curing agent, its amount is very small. For this reason, fluidity of the adhesive is very high, which makes it easy to bury the mesh in the adhesive. Furthermore, adhesive property can be imparted to the adhesive by irradiating the active energy ray to the adhesive and curing it after the mesh is buried in the adhesive. Therefore, a uniform adhesive layer can be produced, and a relatively high adhesive force can be obtained.

Examples of the acrylic polymer constituting the adhesive of active energy ray curing type include an acrylic polymer obtained by copolymerizing two or more monomers selected from a (meth)acrylic ester monomer, a monomer having a reactive functional group, and a vinyl monomer that is copolymerizable with an acrylic ester monomer. At least one kind or more of monomers containing a hydroxyl group, an acetoacetoxy group, and a carboxyl group is preferably copolymerized as the monomer having a reactive functional group from the aspect of adhesive property. Such an acrylic polymer can be synthesized by a known method.

The weight average molecular weight of the acrylic polymer constituting the adhesive of active energy ray curing type is preferably 400,000 to 2000,000, more preferably 900,000 to 2,000,000, and particularly preferably 1,000,000 to 1,600,000, in order to maintain the cohesion force. Further, the glass transition point of the acrylic polymer is preferably $-60°$ C. to $-5°$ C., and more preferably $-50$ to $-10°$ C. When it is less than $-60°$ C., the cohesion force becomes insufficient, and when it exceeds $-5°$ C., there is a fear that an insufficiency occurs in the adhesive property.

Examples of the monomer that can be used in the synthesis of the acrylic polymer constituting the adhesive of active energy ray curing type are given below. However, the monomer that can be used in the synthesis of the acrylic polymer is not limited thereto, and any known monomers can be also used.

Examples of the (meth) acrylic ester monomer include methyl acrylate, methyl methacrylate, ethyl acrylate, ethyl methacrylate, butyl acrylate, butyl methacrylate, isobutyl acrylate, isobutyl methacrylate, isopropyl acrylate, 2-ethylhexyl acrylate, 2-ethylhexyl methacrylate, lauryl acrylate, dimethylaminomethyl methacrylate, and dimethylaminoethyl methacrylate.

Examples of the monomer having a reactive functional group include acrylic acid, methacrylic acid, itaconic acid, 2-hydroxyethyl acrylate, 2-hydroxyethyl methacrylate, 4-hydroxybutyl acrylate, 2-acetoacetoxyethyl methacrylate, acrylamide, glycidyl methacrylate, and 2-methacryloyloxyethyl isocyanate.

Examples of the another vinyl monomer that is copolymerizable with the (meth)acrylic ester monomer include vinyl acetate, styrene, α-methylstyrene, acrylonitrile, and vinyltoluene.

Examples of the active energy ray reactive compound include a known monomer and oligomer that are three-dimensionally crosslinked by irradiation with the active energy ray. They have two or more acryloyl groups or methacryloyl groups in a molecule. The active energy ray reactive compound is preferably compounded in an amount of 0.1 to 50 parts by weight, more preferably 0.1 to 40 parts by weight, and particularly preferably 0.1 to 20 parts by weight, with respect to 100 parts by weight of the acrylic polymer. When it is less than 0.1 parts by weight, the three-dimensional crosslinking by the irradiation with the active energy ray becomes insufficient, which fails to obtain a necessary cohesion force. When it exceeds 50 parts by weight, the three-dimensional crosslinking by the irradiation with the active energy ray becomes excessive, and no necessary adhesive force may be obtained.

Examples of the monomer which is three-dimensionally crosslinked by irradiation with the active energy include a monomer such as 1,6-hexanediol diacrylate, trimethylolpropane triacrylate, trimethylolpropane methacrylate, and dipentaerithritol hexacrylate, but the monomer is not limited thereto. In order to adjust viscosity, the degree of crosslinking, etc., a monomer having at least one of acryloyl group or methacryloyl group in a molecule may be added as the active energy ray reactive compound.

Further, any known oligomers used as an active energy ray reactive compound can be used as the oligomer that is three-dimensionally crosslinked by the irradiation with the active energy ray. A representative example is a urethane acrylate oligomer, but it is not limited thereto. In order to prevent yellowing with passage of time when used as an adhesive, a urethane acrylate oligomer that does not contain aromatic isocyanate such as tolylene diisocyanate as a raw material is preferably used.

Any conventionally known compounds used as a polymerization inhibitor can be used as the polymerization inhibitor used in the adhesive of active energy ray curing type. Specific examples of the polymerization inhibitor include a hydroquinone compound such as hydroquinone, methoquinone, methylhydroquinone, parabenzoquinone, toluquinone, t-butylhydroquinone, t-butylbenzoquinone, and 2,5-diphenylparabenzoquinone, a phenothiadine compound, and a nitrosamine compound. However, the polymerization inhibitor is not limited to these exemplified compounds.

Examples of other additives are the same ones given as the additives of the adhesive described above. The amount of these additives to be added may be an amount that enables the objective physical properties to be obtained, and it is not particularly limited.

In the invention, the electromagnetic wave shielding material and the adhesive may be contained between two release films. The electromagnetic shielding material and the adhesive may include the electromagnetic wave shielding layer and the adhesive layer in a multi-layered structure, and the electromagnetic shielding material may be buried in the adhesive layer. In particular, the electromagnetic wave shielding material may be covered with the adhesive (for example, FIG. 1 (d)), and at least a part of the electromagnetic wave shielding material may be exposed from the adhesive (for example, FIGS. 1(a), 1(b) and 1(c)). The exposure of the electromagnetic wave shielding material from the adhesive is due to a flowing of the adhesive when the metal mesh is buried. By way of example, specific description will be given to the case that the blackening treatment is applied on the surface of the metal mesh (the opposite face to the base material film described later). In this case, following forms are given. That is, a part or entire face of the blackened face may be exposed, a part or entire face of the face that is not subjected to the blackening treatment (below, referred to as a non-blackened face) may be exposed, or a part of the blackened face and the non-blackened face may be exposed.

The adhesive 2 constituting the electromagnetic wave shielding light-transmitting member of the invention preferably further contains a near-infrared ray absorbing substance, a color correction material, a compound having an ND filter function, etc.

The near-infrared ray absorbing substance means a pigment compound absorbing near-infrared rays. In the case of forming an electromagnetic wave shielding layer of a display such as a plasma display using the electromagnetic wave shielding light-transmitting member of the invention, the near-infrared ray radiated from the display such as a plasma display is absorbed, resulting in prevention of a false operation in switching of other electronic devices including a display, transmission of a computer communication, etc. When the electromagnetic wave shielding light-transmitting member of the invention is applied to a display, the near-infrared ray absorbing substance described above may be a pigment compound absorbing the near-infrared ray emitted from the display. An example of the pigment compound absorbing a near-infrared ray is at least one compound selected from a diimmonium compound of a specific structure, a phthalocyanine compound, a dithiol metal complex compound, a cyanine compound, etc. Use of these compounds alone or in combination allows the near-infrared ray radiated from a display for example to be absorbed. In the invention, the near-infrared ray absorbing substance may be contained not in the electromagnetic wave shielding layer but in a near-infrared ray absorbing layer of a different layer so as to be applied to a display panel. The near-infrared ray absorbing layer will be described later.

Examples of the diimmonium compound preferably used as the near-infrared ray absorbing substance of the invention include a compound having a structure with sulfonimido as an anionic component, which is represented by Formula (1) below.

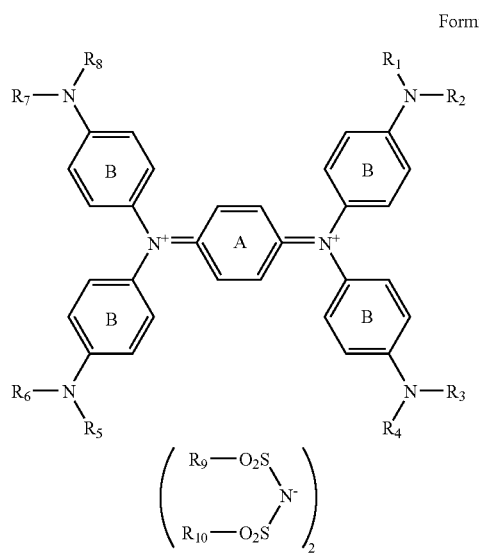

Formula (1)

In Formula (1), $R_1$ to $R_8$ may be the same as or different from each other, and represent a hydrogen atom, an alkyl group that may be substituted, a cycloalkyl group that may be substituted, a halogenated alkyl group that may be substituted, a cyanoalkyl group that may be substituted, an aryl group that may be substituted, a hydroxyl group, or a phenylalkyl group that may be substituted.

Examples of the alkyl group include an alkyl group having 1 to 20 carbon atoms such as a methyl group, an ethyl group, an n-propyl group, an isopropyl group, an n-butyl group, a tert-butyl group, a sec-butyl group, an n-pentyl group, an n-hexyl group, an n-heptyl group, an n-octyl group, an n-decyl group, an n-dodecyl group, and an n-octadecyl group.

Examples of the cycloalkyl group include a cycloalkyl group having 3 to 10 carbon atoms such as a cyclopropyl group, a cyclobutyl group, a cyclopentyl group, a cyclohexyl group, a cycloheptyl group, and a cyclooctyl group.

Examples of the alkenyl group include an alkenyl group having 2 to 10 carbon atoms such as a vinyl group, an allyl group, a 1-propenyl group, an isopropenyl group, a 2-butenyl group, a 1,3-butadienyl group, and a 2-pentenyl group.

Examples of the aryl group include an aryl group having 6 to 12 carbon atoms such as a phenyl group, a tolyl group, a xylyl group, and a naphthyl group.

Examples of substituents bonded to these groups include a cyano group; a nitro group; a hydroxyl group; a tetra hydrofuryl group; a halogen atom such as a fluorine atom, a chlorine atom, and a bromine atom; an alkoxy group having 1 to 10 carbon atoms such as a methoxy group, an ethoxy group, an n-propoxy group, an isopropoxy group, an n-butoxy group, a tert-butoxy group, a sec-butoxy group, an n-pentyloxy group, an n-octyloxy group, and an n-decyloxy group; an alkoxyalkoxy group having 2 to 12 carbon atoms such as a methoxymethoxy group, an ethoxymethoxy group, a propoxymethoxy group, a methoxyethoxy group, an ethoxyethoxy group, a propoxyethoxy group, a methoxypropoxy group, an ethoxypropoxy group, a methoxybutoxy group, and an ethoxybutoxy group; an alkoxyalkoxyalkoxy group having 3 to 15 carbon atoms such as a methoxymethoxymethoxy group, a methoxymethoxyethoxy group, a methoxyethoxymethoxy group, a methoxyethoxyethoxy group, an ethoxymethoxymethoxy group, an ethoxymethoxyethoxy group, an ethoxyethoxymethoxy group, and an ethoxyethoxyethoxy group; an aryloxy group having 6 to 12 carbon atoms such as a phenoxy group, a tolyloxy group, a xylyloxy group, and a naphthyloxy group;

an alkylsulfonylamino group having 1 to 6 carbon atoms such as a methylsulfonylamino group, an ethylsulfonylamino group, an n-propylsulfonylamino group, an isopropylsulfonylamino group, an n-butylsulfonylamino group, a tert-butylsulfonylamino group, a sec-butylsulfonylamino group, an n-pentylsulfonylamino group, and an n-hexylsulfonylamino group; an alkoxycarbonyl group having 2 to 7 carbon atoms such as a methoxycarbonyl group, an ethoxycarbonyl group, an n-propoxycarbonyl group, an isopropoxycarbonyl group, an n-butoxycarbonyl group, a tert-butoxycarbonyl group, a sec-butoxycarbonyl group, an n-pentyloxycarbonyl group, and an n-hexyloxycarbonyl group; an alkylcarbonyloxy group having 2 to 7 carbon atoms such as a methylcarbonyloxy group, an ethylcarbonyloxy group, an n-propylcarbonyloxy group, an isopropylcarbonyloxy group, an n-butylcarbonyloxy group, a tert-butylcarbonyloxy group, an n-pentylcarbonyloxy group, and an n-hexylcarbonyloxy group; and an alkoxycarbonyloxy group having 2 to 7 carbon atoms such as a methoxycarbonyloxy group, an ethoxycarbonyloxy group, an n-propoxycarbonyloxy group, an isopropoxycarbonyloxy group, an n-butoxycarbonyloxy group, a tert-butoxycarbonyloxy group, a sec-butoxycarbonyloxy group, an n-pentyloxycarbonyloxy group, and an n-hexyloxycarbonyloxy group.

Among these $R_1$ to $R_8$, an alkyl group having a straight or branched chain of 1 to 8 carbon atoms, a halogen-substituted alkyl group, and a cyano-substituted alkyl group are preferred, and an alkyl group having a straight or branched chain of 2 to 6 carbon atoms is particularly preferable. Specific examples of the alkyl group having a straight or branched chain of 2 to 6 carbon atoms include an ethyl group, an n-propyl group, an n-butyl group, an n-amyl group, an iso-propyl group, an iso-butyl group, and an iso-amyl group.

Further, another preferable example of $R_1$ to $R_8$ is a phenylalkyl group represented by Formula (2) below:

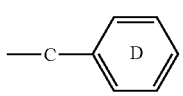

Formula (2)

wherein C represents an alkyl group having a straight or branched chain of 1 to 8 carbon atoms, and a ring D represents a benzene ring that may have a substituent.

In the phenylalkyl group represented by Formula (2), the number of carbon atoms of the alkyl group is preferably 1 to 8. Further, the phenyl group in the phenylalkyl group may not have a substituent, but may have at least one kind of substituents selected from the group consisting of an alkyl group, a hydroxyl group, a sulfonic group, an alkylsulfonic group, a nitro group, an amino group, an alkoxy group, a halogen-substituted alkyl group, and a halogen atom. It is preferably a phenyl group having no substituent.

Examples of such a phenylalkyl group include a benzyl group, a phenetyl group, a phenylpropylene group, a phenyl-α-methylpropylene group, a phenyl-β-methylpropylene group, a phenylbutylene group, a phenylpentylene group, and a phenyloctylene group, and preferable are a benzyl group and a phenetyl group. These phenylalkyl groups are preferable because they improve the heat resistance of the diimmonium compound.

Rings A and B in Formula (1) may have 1 to 4 substituents besides the 1- and 4-positions. Examples of the substituent that can be bonded include a halogen atom, a hydroxyl group, a lower alkoxy group, a cyano group, and a lower alkyl group. Examples of the halogen atom include a fluorine atom, a chlorine atom, a bromine atom, and an iodine atom. An example of the alkoxy group is an alkoxy group of $C_1$ to $C_5$ such as a methoxy group and an ethoxy group, and an example of the lower alkyl group is an alkyl group of $C_1$ to $C_5$ such as a methyl group and an ethyl group. The rings A and B preferably have no substituent or are substituted with a halogen atom (particularly, a chlorine atom and a bromine atom), a methyl group, or a cyano group. Moreover, when the ring B has a substituent, all the four rings B are preferably the same, and the position of the substituent is preferably an m-position to a nitrogen atom to be bonded to a phenylene diamine skeleton from the viewpoint of synthesis. Furthermore, the rings A and B do not preferably have a substituent other than the 1- and 4-positions from the viewpoint of synthesis.

$R_9$ and $R_{10}$ in the anionic component in Formula (1) are not particularly limited in the number of fluorine atoms substituted and the number of carbon atoms as long as they are the same or different fluoroalkyl groups or fluoroalkyrene groups formed by combining these. Preferable examples of $R_9$ and $R_{10}$ include the same or different perfluoroalkyl groups having 1 to 8 carbon atoms. That is, one preferable example of the anionic component is an anionic component represented by Formula (3) below:

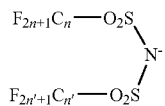

Formula (3)

wherein n and n' each represent an integer of 1 to 8.

Here, n and n' each are an integer of 1 to 8, and preferably an integer of 1 to 4. Preferable specific examples thereof include bis(trifluoromethanesulfon)imide, bis(pentafluoroethanesulfon)imide, etc. having the same perfluoroalkanesulfonyl group (that is, n and n' are the same integer); and pentafluoroethanesulfontrifluoromethanesulfonimide, trifluoromethanesulfonhepta fluoropropanesulfonimide, nonafluorobutanesulfontrifluoromethanesulfonimide, etc. having different perfluoroalkanesulfonyl groups (that is, n and n' are different integers).

Among these, bis(trifluoromethanesulfon)imide and bis(pentafluoroethanesulfon)imide having the same perfluoroalkanesulfon group (that is, n and n' are the same integer), n and n' being 1 or 2, are more preferable in terms of the near infrared absorbing ability.

Another preferable example of $R_9$ and $R_{10}$ in the anionic component in Formula (1) is a perfluoroalkyleren group having to 12 carbon atoms formed by combining these as represented by Formula (4) below:

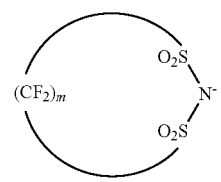

Formula (4)

wherein m represents an integer of 2 to 12.

Here, m is preferably an integer of 2 to 8, and more preferably, an example is 1,3-disulfonylhexafluoropropylene imide represented by Formula (5) below having m equal to 3.

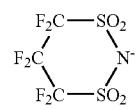

Formula (5)

The anion represented by the above Formula (4) having a perfluoroalkylene group having 2 to 12 carbon atoms formed by combining $R_9$ and $R_{10}$ in the above Formula (1) is preferable because the heat resistance is improved compared with the case of using the anion in Formula (3) in which $R_9$ and $R_{10}$ are independent as the anion component.

Specific examples of the diimmonium compound represented by Formula (1) for use in the invention include bis(trifluoromethanesulfon)imidic acid N,N,N',N'-tetrakis{p-di(n-butyl)aminophenyl}-p-phenylene diimmonium represented by Formula (6) below;

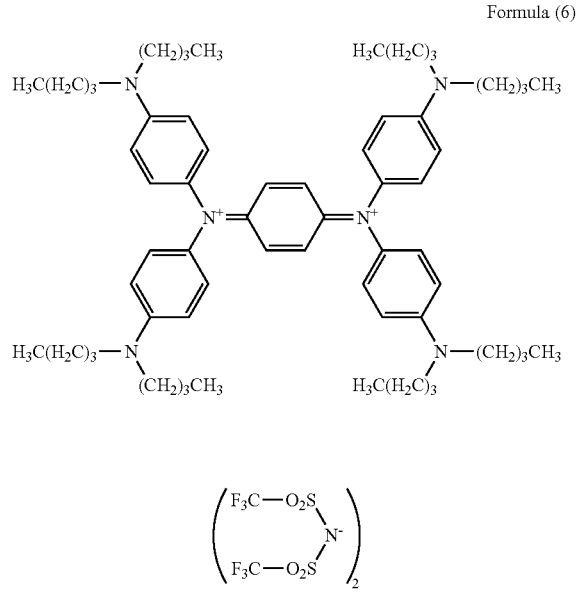

Formula (6)

bis(pentafluoroethanesulfon)imidic acid N,N,N',N'-tetrakis{p-di(n-butyl)aminophenyl}-p-phenylene diimmonium represented by Formula (7) below;

bis(pentafluoroethanesulfon)imidic acid N,N,N',N'-tetrakis{p-di(n-butyl)aminophenyl}-p-phenylene diimmonium represented by Formula (7) below;

bis{bis(trifluoromethanesulfon)imidic acid}N,N,N',N'-tetrakis(p-benzylaminophenyl)-p-phenylene diimmonium represented by Formula (9) below;

Formula (7)

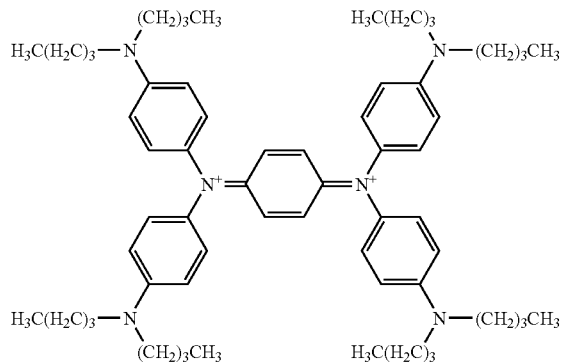

Formula (9)

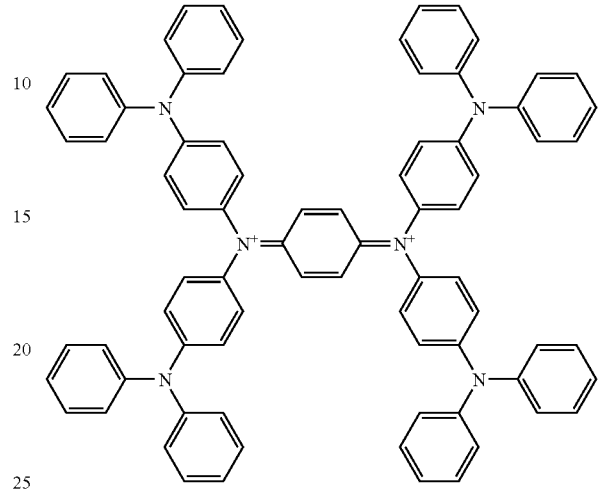

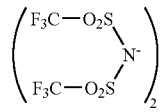

bis(trifluoromethanesulfon)imidic acid N,N,N',N'-tetrakis{p-di(iso-butyl)aminophenyl}-p-phenylene diimmonium represented by Formula (8) below;

bis{bis(trifluoromethanesulfon)imidic acid}N,N,N',N'-tetrakis(p-diphenetylaminophenyl)-p-phenylene diimmonium represented by Formula (10) below;

Formula (8)

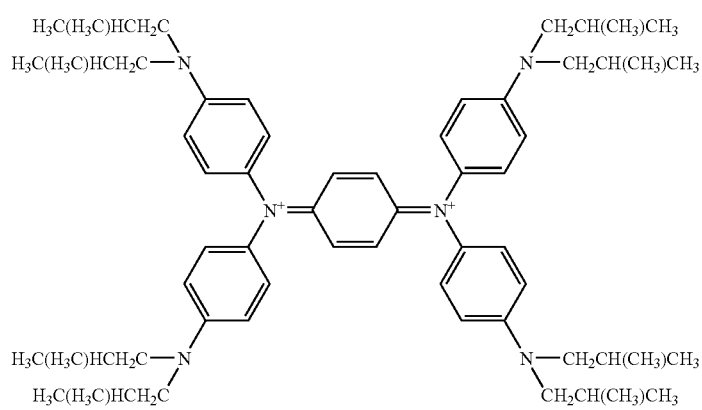

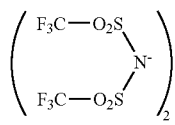

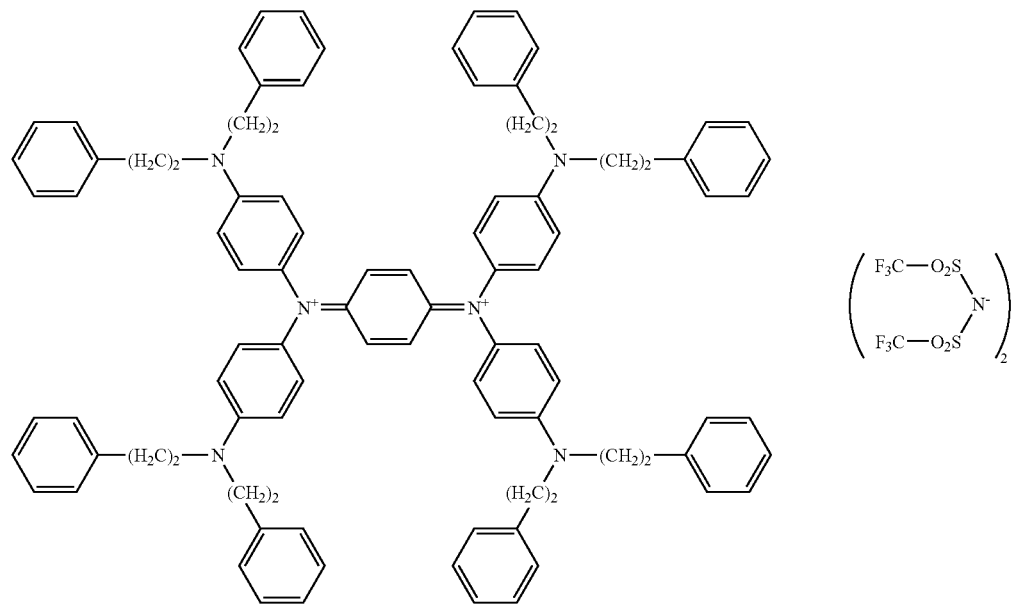
Formula (10)
bis{bis(trifluoromethanesulfon)imidic acid}N,N,N',N'-tetrakis{p-di(4-fluorinated)benzylaminophenyl}-p-phenylene diimmonium represented by Formula (11) below;
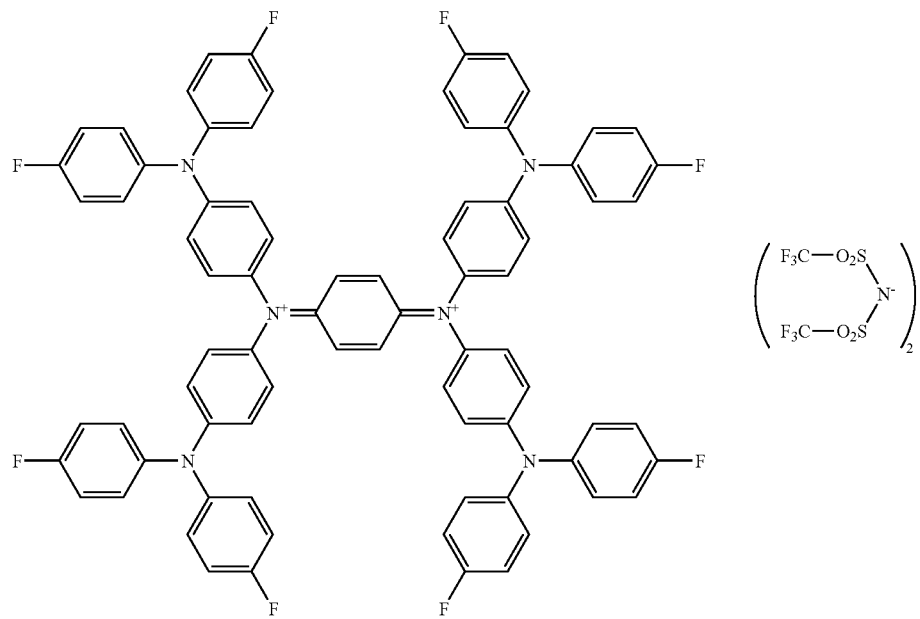
Formula (11)
bis(1,3-disulfonylhexafluoropropyleneimidic acid)N,N,N',N'-tetrakis(p-diphenetylaminophenyl)-p-phenylene diimmonium represented by Formula (12) below;

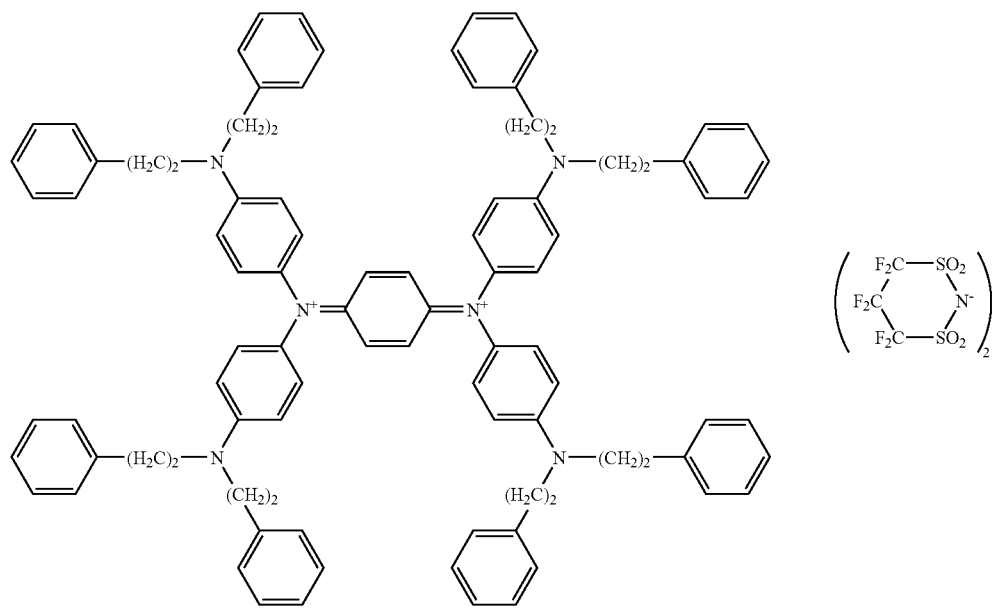

Formula (12)

and bis(1,3-disulfonylhexafluoropropyleneimidic acid) N,N,N',N'-tetrakis(p-dibutylaminophenyl)-p-phenylene diimmonium represented by Formula (13) below.

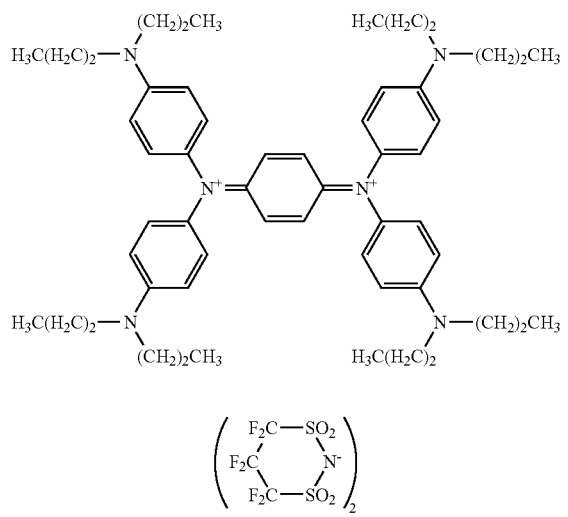

Formula (13)

The diimmonium compound represented by Formula (1) for use in the invention can be obtained by a method as below disclosed in, for example, Japanese Patent Application Publication (JP-B) No. 43-25335. That is, a product obtained by an Ullmann reaction of p-penylenediamine and 1-chloro-4-nitrobenzene is reduced to obtain an aminated substance represented by Formula (14) below. The aminated substance is allowed to react with a halogenated compound corresponding to the desired $R_1$ to $R_8$ (for example, $BrC_4H_9$ when $R_1$ is n-$C_4H_9$) in an organic solvent, preferably in a water-soluble polar solvent such as dimethylformamide, 1,3-dimethyl-2-imidazolidin one, and N-methylpyrrolidone at 30 to 160° C., preferably 50 to 140° C., to thereby obtain a compound in which all substituents ($R_1$ to $R_8$) are the same (herein after, referred to as an all-substituted substance). Further, in the case of synthesizing a compound other than the all-substituted substance, for example, the aminated substance is allowed to react with a reagent ($BrC_4H_9$) of a designated mole number (7 mol per aminated substance of one mol) to introduce an n-butyl group into 7 out of $R_1$ to $R_8$, and is then allowed to react with a reagent ($BrC_4H_9BrCH_2CH(CH_3)_2$) of a mole number necessary to introduce the remaining substituent (an iso-butyl group) (1 mol per aminated substance of one mol).

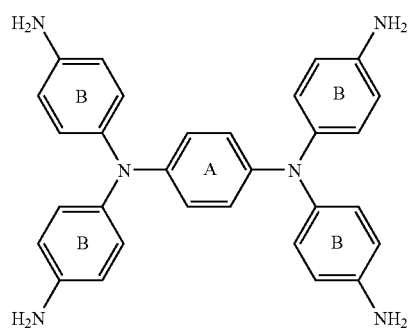

Formula (14)

(In the formula, rings A and B are as defined as described above.)

Thereafter, an oxidation reaction is conducted on the compound synthesized above by adding a silver sulfonimidate derivative represented by Formula (15) below in an organic solvent, preferably in a water-soluble polar solvent such as dimethylformamide, 1,3-dimethyl-2-imidazolidin one, N-methylpyrrolidone, and acetonitrile at 0 to 100° C., preferably 5 to 70° C. The separated silver is filtrated, followed by addition of a solvent such as water, ethyl acetate, and hexane, and filtering the produced precipitate, to obtain the diimmonium compound represented by Formula (1) of the invention.

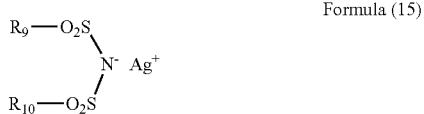

Formula (15)

(In the Formula, $R_9$ and $R_{10}$ are as Defined as Described Above.)

Examples of a commercially available product of the diimmonium compound represented by the above Formula (1) include "CIR-LR" and "CIR-1085" (both are manufactured by Japan Carlit Co., Ltd.) and "K-1032" (manufactured by Nippon Kayaku Co., Ltd.).

The content of the diimmonium compound included in the adhesive in the invention is determined by the thickness of a near-infrared ray absorbing layer formed by the adhesive of the invention and the required absorbing ability of the near-infrared ray absorbing layer. For example, assuming that the absorbing ability is constant, in the case that the film thickness of a near-infrared ray absorbing layer to be formed is thin, it is necessary to add a large amount of the diimmonium compound in the adhesive, and on the contrary, in the case that the film thickness of a near-infrared ray absorbing layer to be formed is thick, the amount of the diimmonium compound added in the adhesive may be small. That is, the content of the diimmonium compound in the adhesive and the film thickness of the near-infrared ray absorbing layer to be formed can be determined depending on the required near-infrared ray absorbing ability.

As described above, the amount of the diimmonium compound added changes due to various factors. In general, it is preferably 1 to 1000 mg, and more preferably 5 to 500 mg per unit area 1 m$^2$ of the near-infrared ray absorbing layer formed by the adhesive of the invention. For example, as for an amount to the resin constituting the adhesive, the diimmonium compound is preferably compounded in an amount of 0.1 to 10 parts by weight, and more preferably 0.5 to 5 parts by weight with respect to 100 parts by weight of the resin constituting the adhesive. In the case that the amount of the diimmonium compound compounded is less than the range, the film thickness of the near-infrared ray absorbing layer is preferably made to be substantially thick in order to obtain the desired near-infrared ray absorbing ability. On the other hand, when the amount of the diimmonium compound compounded exceeds the range, transmittance of visible light may decrease. For this reason, the thickness of the near-infrared ray absorbing layer is preferably made to be substantially thin.

Moreover, the diimmonium compound represented by Formula (1) has a near-infrared ray absorbing ability in the range of 850 to 1200 nm and particularly has a strong near-infrared ray absorbing ability around 1000 nm. The diimmonium compound shields light having the wavelength of computer communication that is anticipated to be used in the future as well as the light having the wavelength of near-infrared rays used in a remote control, etc., and the effect of preventing false operation in the computer communication is also expected.

A phthalocyanine compound, a dithiol metal complex, and a cyanine compound used as the near-infrared ray absorbing substance in the invention will be explained below. These phthalocyanine compound, dithiol metal complex, and cyanine compound described later may be used alone or two arbitrary kinds or more of the near-infrared ray absorbing substances may be used in combination. However, the diimmonium compound and any one kind of the phthalocyanine compound, the dithiol metal complex, and the cyanine compound are preferably used in combination.

The phthalocyanine compound used in the invention is phthalocyanin, a phthalocyanine complex, or phthalocyanine and a phthalocyanine complex, which have one kind or more of OR, SR, NHR, and NRR' on a benzene ring in the phthalocyanine skeleton. Here, R and R' may be the same or different, and represent a phenyl group that may have a substituent, an alkyl group having 1 to 20 carbon atoms, or an aralkyl group having 7 to 20 carbon atoms. In addition, the phthalocyanine compound, one of the substituents of which is substituted with NHR, is preferred.

A preferred example of the phthalocyanine compound used in the invention is a compound represented by Formula (16) below. The compound represented by Formula (16) is superior in solvent dissolvability and also in compatibility with a polymer. When the near-infrared ray absorbing layer employing the phthalocyanine compound represented by Formula (16) is used as a near-infrared ray absorbing filter, it is possible to obtain a near-infrared ray absorbing filter which has, particularly, a high visible light transmittance, a high near-infrared ray absorption efficiency, and excellent heat resistance and light resistance:

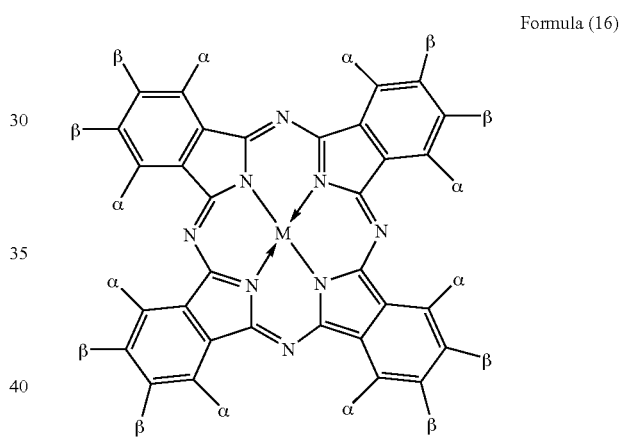

Formula (16)

wherein α's may be the same or different from each other and represent $SR_{15}$, $OR_{16}$, $NHR_{17}$, or a halogen atom, and at least one of α's is $NHR_{17}$; $R_{15}$, $R_{16}$, and $R_{17}$ may be the same or different from each other and represent a phenyl group, an alkyl group having 1 to 20 carbon atoms or an aralkyl group having 7 to 20 carbon atoms, that may have a substituent; β's may be the same or different from each other and represent $SRR_{15}$, $OR_{16}$, or a halogen atom, $SR_{15}$ and $OR_{16}$ being indispensable; and M represents a non-metal, a metal, a metal oxide, or a metal halide.

In the above Formula (16), examples of the alkyl group having 1 to 20 carbon atoms include a straight- or branched-chain alkyl group such as a methyl group, an ethyl group, a propyl group, an isopropyl group, an n-butyl group, an isobutyl group, a sec-butyl group, a tert-butyl group, an n-pentyl group, an isopentyl group, a neopentyl group, a 1,2-dimethylpropyl group, an n-hexyl group, a 1,3-dimethylbutyl group, a 1-isopropylpropyl group, a 1,2-dimethylbutyl group, an n-heptyl group, a 1,4-dimethyl pentyl group, a 2-methyl-1-isopropylpropyl group, a 1-ethyl-3-methylbutyl group, an n-octyl group, and a 2-ethylhexyl group; and a cyclic alkyl group such as a cyclohexyl group. Examples of the aralkyl group having 7 to 20 carbon atoms include a benzyl group and a phenetyl group. Examples of the halogen atom include a fluorine atom, a chlorine atom, a bromine atom, and an iodine atom, and a fluorine atom is preferred.

The phenyl group, the alkyl group having 1 to 20 carbon atoms, and the aralkyl group having 7 to 20 carbon atoms in the $R_{15}$, $R_{16}$, and $R_{17}$ may have one or two or more substituents. Examples of such substituents include a halogen atom, an acyl group, an alkyl group, an alkoxy group, a halogenated alkoxy group, a nitro group, an amino group, an alkyl amino group, an alkylcarbonylamino group, an aryl amino group, an aryl carbonyl amino group, a carbonyl group, and an alkoxycarbonyl group.

In M in the above Formula (16), the non-metal means an atom other than metal, for example, two hydrogen atoms. Specifically, it has a structure that a hydrogen atom is bonded with two facing nitrogen atoms that exist in a center part of the phthalocyanine structure and that may have a substituent. Examples of the metal include iron, magnesium, nickel, cobalt, copper, palladium, zinc, vanadium, titanium, indium, and tin. Examples of the metal oxide include titanyl and vanadyl. Examples of the metal halide include aluminum chloride, indium chloride, germanium chloride, tin chloride, and silicon chloride. M is preferably a metal, a metal oxide, or a metal halide, and specific examples thereof include nickel, cobalt, copper, zinc, iron, vanadyl, and dichloro tin. It is more preferably zinc, copper, cobalt, vanadyl, and dichloro tin.

In the modes of compound represented by the above Formula (16), 4 to 8 β's in 8 β's of the phthalocyanine represent preferably $SR_1$ or $OR_2$ which may be the same or different, and more preferably, all the 8 P's are $SR_1$ or $OR_2$ which may be the same or different. Examples of such a phthalcyanine compound include phthalocyanine compounds represented by the abbreviations of $ZnPc(PhS)_8(PhNH)_3F_5$, $ZnPc(PhS)_8$ $(PhNH)_4F_4$, $ZnPc(PhS)_8(PhNH)_5F_3$, $ZnPc(PhS)_8$ $(PhCH_2NH)_4F_4$, $ZnPc(PhS)_8(PhCH_2NH)_5F_3$, $ZnPc(PhS)_8$ $(PhCH_2NH)_6F_2$, $CuPc(PhS)_8(PhNH)_7F$, $CuPc(PhS)_8$ $(PhNH)_6$ $F_2$, $CuPc(PhS)_8(PhNH)_5F_3$, $VOPc(PhO)_8$ $(PhCH_2NH)_5F_3$, $VOPc(PhO)_8(PhCH_2NH)_6F_2$, $VOPc(PhO)_8$ $(PhCH_2NH)_8$, $VOPc(PhS)_8(PhCH_2NH)_8$, $VOPc(2,5-Cl_2PhO)_8\{2,6-(CH_3)_2PhO\}_4\{Ph(CH_3)CHNH\}_3F$, $VOPc(2,5-Cl_2PhO)_8\{2,6-(CH_3)_2PhO\}_4(PhCH_2NH)_4$, $CuPc(2,5-Cl_2PhO)_8\{2,6-(CH_3)_2PhO\}_4\{PhCH_2NH\}_4$, $CuPc(PhS)_8\{2,6-(CH_3)_2PhO\}_4(PhCH_2NH)_4$, $VOPc(4-CNPhO)_8\{2,6-Br_2-4-(CH_3)PhO\}_4\{Ph(CH_3)CHNH\}_4$, and $ZnPc(2,4-Cl_2PhO)_8$ $\{2,6-Br_2-4-(CH_3)PhO\}_4\{Ph(CH_3)CHNH\}_3F$.

Among these compounds, preferred are phthalocyanine compounds in which 4 out of 8 α's may be the same or different and represent $OR_2$ or a halogen atom. Examples thereof include phthalocyanine compounds represented by the abbreviations of $ZnPc(PhS)_8(PhNH)_3F_5$, $ZnPc(PhS)_8$ $(PhNH)_4F_4$, $ZnPc$ $(PhS)_8(PhCH_2NH)_4F_4$, $VOPc(2,5-Cl_2PhO)_8\{2,6-(CH_3)_2PhO\}_4\{Ph(CH_3)CHNH\}_3F$, $VOPc$ $(2,5-Cl_2PhO)_8\{2,6-(CH_3)_2PhO\}_4(PhCH_2NH)_4$, $CuPc$ $(2,5-Cl_2PhO)_8\{2,6-(CH_3)_2PhO\}_4(PhCH_2NH)_4$, $CuPc$ $(PhS)_8\{2,6-(CH_3)_2PhO\}_4(PhCH_2NH)_4$, $VOPc(4-CNPhO)_8\{2,6-Br_2-4-(CH_3)PhO\}_4\{Ph(CH_3)CHNH\}_4$, and $ZnPc(2,4-Cl_2PhO)_8$ $\{2,6-Br_2-4-(CH_3)PhO\}_4\{Ph(CH_3)CHNH\}_3F$.

Moreover, in the abbreviations of the compounds, Pc represents a phthalocyanine core, 8 substituents substituted in a β-position are represented after Pc, and after that, 8 substituents substituted in an α-position. The Ph represents a phenyl group. More specifically, the abbreviations each represent a center metal: Pc: 8 substituents in the β-position: 8 substituents in the α-position. For example, $VOCPc(2,5-Cl_2PhO)_8\{2,6-(CH_3)_2PhO\}_4\{Ph(CH_3)CHNH\}_3F$ denotes a phthalocyanine compound in which the center metal is VO: a phthalocyanine core: 8 of $2,5-Cl_2PhO$ are substituted in the β-position: 4 of $2,6-(CH_3)_2PhO$, 3 of $Ph(CH_3)CHNH$, and one of F are substituted in the α-position.

A method for manufacturing the phthalocyanine compound represented by the above Formula (16) is not particularly limited, and a conventionally known method can be appropriately used. For example, the phthalocyanine compound may be caused to cyclization-react with one kind selected from a metal salt, a metal oxide, a metal carbonyl, a metal halide, and an organic acid metal, followed by reaction with an amino compound to produce the phthalocyanine compound represented by the above Formula (16).

Examples of a commercially available product of the phthalcyanine compound represented by the above Formula (16) include "EX Color IR10A", "EX Color IR12", "EX Color IR14", "EX Color HA-1", and "EX Color HA-14" (all are manufactured by Nippon Shokubai Co., Ltd.). "EX Color IR10A", "EX Color IR12", and "EX Color IR14" are preferred from the viewpoints of solvent solubility of the phthalocyanine compound and compatibility with a polymer thereof and the viewpoints of visible light transmittance and near-infrared absorption efficiency when used as a near-infrared absorption filter.

The amount of the phthalocyanine compound added to the adhesive constituting the electromagnetic wave shielding light-transmitting member of the invention is determined by the near-infrared absorption power of the phthalocyanine compound used, the film thickness of the adhesive layer, and the required absorption power. Assuming that the absorption power is constant, there is a necessity to add a large amount of the phthalocyanine compound in the adhesive, and on the contrary, in the case that the film thickness of the near-infrared absorbing layer to be formed is thick, the amount of the phthalocyanine compound added to the adhesive may be small. That is, the content of the phthalocyanine compound in the adhesive and the film thickness of the near-infrared absorbing layer to be formed can be determined depending on the required near-infrared absorption power. For example, assuming that the absorption power is constant, it is necessary to add a large amount of the phthalocyanine compound to the adhesive in the case that the film thickness of the near-infrared absorbing layer to be formed is thin, and on the contrary, when the film thickness of the near-infrared absorbing layer to be formed is thick, the amount of the phthalocyanine compound added to the adhesive may be small. In other words, the content of the phthalocyanine compound in the adhesive and the film thickness of the near-infrared absorbing layer to be formed can be determined depending on the required near-infrared absorption power.

The amount of the phthalocyanine compound added is specifically preferably 1 to 1,000 mg, and more preferably 5 to 500 mg per unit area 1 $m^2$ of the near-infrared absorbing layer formed according to the adhesive of the invention. As for a compounding amount to the resin constituting the adhesive, the phthalocyanine compound is preferably compounded in an amount of 0.1 to 10 parts by weight, and more preferably 0.2 to 5 parts by weight with respect to 100 parts by weight of the resin constituting the adhesive.

When the amount of the phthalocyanine compound is less than the range, the film thickness of the adhesive layer is preferably made to be considerably thicker in order to obtain the desired near-infrared absorption power. When the amount of the phthalocyanine compound exceeds the range, on the other hand, transmittance of visible ray may decrease. For this reason, the film thickness of the adhesive layer is preferably made to be considerably thinner.

These phthalocyanine complex compounds represented by Formula (16) have characteristics that the absorption maximum thereof is in the near-infrared range of 800 to 900 nm and the absorption in the visible light range is small. When the phthalocyanine complex compound is combined with the diimmonium compound, the near-infrared range of 800 to 1000 nm is absorbed and shielded with good efficiency due to the multiplier effect of both, resulting in absorption of an unnecessary near-infrared ray emitted by a plasma display. Further, it is known that the heat resistance of the diimmonium compound remarkably decreases in the case of being mixed with other pigments in general. However, there is less chance of decline in the heat resistance of the diimmonium compound when mixed with the phthalocyanine compound. With respect to this point, using the both is preferable.

The dithiol metal complex compound that can be used as the near-infrared absorbing substance of the adhesive constituting the electromagnetic-wave shielding light-transmitting member of the invention is not particularly limited as long as it is a compound called dithiol metal complex compound in general. Specifically, preferable is a metal complex compound represented by Formula (17) below:

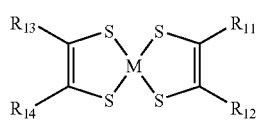

Formula (17)

wherein $R_{11}$ to $R_{14}$ may be the same or different from each other, and represent a hydrogen atom, a halogen atom, a cyano group, an acyl group, a carbamoyl group, an alkylaminocarbonyl group, an alkoxycarbonyl group, an aryloxycarbonyl group, a substituted or unsubstituted alkyl group, or a substituted or unsubstituted aryl group, and two adjacent substituents may be connected through a connection group; and M is a metal of nickel, platinum, palladium, or copper.

One kind or two or more kinds of these dithiol metal complex compounds represented by Formula (17) may be used. The substituents represented with $R_{11}$ to $R_{14}$ in the dithiol metal complex compounds represented by Formula (17) will be specifically explained below.

Examples of the halogen atom include a fluorine atom, a chlorine atom, a bromine atom, and an iodine atom.

Examples of the acyl group include an acetyl group, an ethylcarbonyl group, a propylcarbonyl group, a butylcarbonyl group, a pentylcarbonyl group, a hexylcarbonyl group, a benzoyl group, and a p-t-butylbenzoyl group.

Examples of the alkylaminocarbonyl group include a methylaminocarbonyl group, an ethylaminocarbonyl group, an n-propylaminocarbonyl group, an n-butylaminocarbonyl group, a sec-butylaminocarbonyl group, an n-pentylaminocarbonyl group, an n-hexylaminocarbonyl group, an n-heptylaminocarbonyl group, an n-octylaminocarbonyl group, a 2-ethylhexylaminocarbonyl group, a dimethylaminocarbonyl group, a diethylaminocarbonyl group, a di-n-propylaminocarbonyl group, a di-n-butylaminocarbonyl group, a di-sec-butylaminocarbonyl group, a di-n-pentylaminocarbonyl group, a di-n-hexylaminocarbonyl group, a di-n-heptylaminocarbonyl group, and a di-octylaminocarbonyl group.

Examples of the alkoxycarbonyl group include a straight- or branched-chain alkyloxycarbonyl group having 2 to 20 carbon atoms, such as amethoxycarbonyl group, an ethoxycarbonyl group, an n-propoxycarbonyl group, an iso-propoxycarbonyl group, an n-butoxycarbonyl group, an iso-butoxycarbonyl group, a sec-butoxycarbonyl group, a t-butoxycarbonyl group, an n-pentyloxycarbonyl group, an iso-pentyloxycarbonyl group, a neo-pentyloxycarbonyl group, a 1,2-dimethyl-propyloxycarbonyl group, an n-hexyloxycarbonyl group, a cyclohexyloxycarbonyl group, a 1,3-dimethyl-butyloxycarbonyl group, a 1-iso-propylpropyloxycarbonyl group, a 1,2-dimethylbutyloxycarbonyl group, an n-heptyloxycarbonyl group, a 1,4-dimethylpentyloxycarbonyl group, a 2-methyl-1-iso-propylpropyloxycarbonyl group, a 1-ethyl-3-methylbutyloxycarbonyl group, an n-octyloxycarbonyl group, a 2-ethylhexyloxycarbonyl group, a 3-methyl-iso-propylbutyloxycarbonyl group, a 2-methyl-1-iso-propyloxycarbonyl group, a 1-t-butyl-2-methylpropyloxycarbonyl group, and an n-nonyloxycarbonyl group.

Examples of the aryloxycarbonyl group include a phenyloxycarbonyl group, a naphthyloxycarbonyl group, a trioxycarbonyl group, a xylyloxycarbonyl group, and a chlorophenyloxycrabonyl group.

Examples of the unsubstituted alkyl group among the substituted or unsubstituted alkyl groups include a straight, branched, or cyclic hydrocarbon group having 1 to 20 carbon atoms, such as a methyl group, an ethyl group, an n-propyl group, an iso-propyl group, an n-butyl group, an iso-butyl group, a sec-butyl group, a t-butyl group, an n-pentyl group, an iso-pentyl group, a neo-pentyl group, a cyclopentyl group, a 1,2-dimethylpropyl group, an n-hexyl group, a cyclohexyl group, a 1,3-dimethylbutyl group, a 1-iso-propylpropyl group, a 1,2-dimethylbutyl group, an n-heptyl group, a 1,4-dimethylpentyl group, a2-methyl-1-iso-propylpropyl group, a 1-ethyl-3-methylbutyl group, an n-octyl group, a 2-ethylhexyl group, a 3-methyl-1-iso-propylbutyl group, a 2-methyl-1-iso-propyl group, a 1-t-butyl-2-methylpropyl group, an n-nonyl group, and a 3,5,5-trimethylhexyl group.

The substituted alkyl group is a group in which at least one hydrogen atom in the unsubstituted alkyl group is substituted with various functional groups.

Examples of the substituted alkyl group include an alkoxyalkyl group in which a hydrogen atom in the unsubstituted alkyl group is substituted with an alkoxy group; an alkoxyalkoxyalkyl group in which a hydrogen atom in the unsubstituted alkyl group is substituted with an alkoxyalkoxy group; an alkoxyalkoxyalkoxyalkyl group in which a hydrogen atom in the unsubstituted alkyl group is substituted with an alkoxyalkoxyalkoxy group; a halogenated alkyl group in which a hydrogen atom in the unsubstituted alkyl group is substituted with a halogen atom; an aminoalkyl group in which a hydrogen atom in the unsubstituted alkyl group is substituted with an amino group; an alkylaminoalkyl group and a dialkylaminoalkyl group in which a hydrogen atom in the unsubstituted alkyl group is substituted with an alkylamino group; and other alkoxycarbonylalkyl groups, alkylaminocarbonylalkyl groups, and alkoxysulfonylalkyl groups.

Examples of the alkoxyalkyl group include a methoxymethyl group, a methoxyethyl group, an ethoxyethyl group, a propoxyethyl group, a butoxyethyl group, a 3-methoxypropyl group, a 3-ethoxypropyl group, a methoxyethoxymethyl group, an ethoxyethoxyethyl group, a dimethoxymethyl group, a diethoxymethyl group, a dimethoxyethyl group, and a diethoxyethyl group. Examples of the halogenated alkyl group include a chloromethyl group, a 2,2,2-trichloroethyl group, a trifluoromethyl group, and a 1,1,1,3,3,3-hexa fluoro-2-propyl group. Further, examples of an alkyl group of the alkylamino group and the dialkylamino group, and examples of an alkoxy group and an alkyl group of the alkoxycarbonylalkyl group, the alkylaminocarbonylalkyl group and the alkoxysulfonylalkyl group include the same groups as the above-described alkyl group and the above-described alkoxy group of the alkoxyalkyl group.

Examples of the unsubstituted aryl group among the substituted or unsubstituted aryl groups include a phenyl group, a naphthyl group, and a biphenyl group. The substituted aryl group is a group in which at least one hydrogen atom in the unsubstituted aryl group is substituted with various functional groups.

Examples of the substituted phenyl group include a halogenated phenyl group such as a chlorophenyl group, a dichlorophenyl group, a trichlorophenyl group, a bromophenyl group, a fluorophenyl group, a penta fluorophenyl group, and an iodinated phenyl group; an alkyl derivative-substituted phenyl group such as a tolyl group, a xylyl group, a mesityl group, an ethylphenyl group, a dimethylethylphenyl group, an iso-propylphenyl group, a t-butylphenyl group, a t-butylmethylphenyl group, an octylphenyl group, a nonylphenyl group, and a trifluotomethylphenyl group;

an alkoxy substitutedphenyl group such as a methoxyphenyl group, an ethoxyphenyl group, a propoxyphenyl group, an isopropoxyphenyl group, a hexyloxyphenyl group, a cyclohexyloxyphenyl group, an octyloxyphenyl group, a 2-ethylhexyloxyphenyl group, a 3,5,5-trimethylhexyloxyphenyl group, a methylethoxyphenyl group, a dimethoxyphenyl group, a 1-methoxy-5-ethoxyphenyl group, a 1-methoxy-2-ethoxyphenyl group, a 1-methoxy-3-ethoxyphenyl group, a 1-methoxy-4-ethoxyphenyl group, a 1-ethoxy-2-methoxyphenyl group, a 2-methoxy-3-ethoxyphenyl group, a 2-methoxy-4-ethoxyphenyl group, a 2-methoxy-5-ethoxyphenyl group, a 1-ethoxy-4-methoxyphenyl group, a 2-methoxy-3-ethoxyphenyl group, a diethoxyphenyl group, an ethoxyethoxyphenyl group, a di(ethoxyethoxy)phenyl group, an ethoxyethoxyethoxyphenyl group, a di(ethoxyethoxyethoxy)phenyl group, a 3-methoxy-4-(2-methoxyethoxy)phenyl group, a 3-methoxy-4-(2-ethoxyethoxy)phenyl group, a 3-ethoxy-4(2-methoxyethoxy)phenyl group, a 3-ethoxy-4-(2-ethoxyethoxy)phenyl group, a 3-propoxy-4-(2-methoxyethoxy)phenyl group, a 3-propoxy-4-(2-ethoxyethoxy)phenyl group, a 3-iso-propoxy-4-(2-methoxyethoxy) phenyl group, a 3-iso-propoxy-4-(2-ethoxyethoxy)phenyl group, a 2-(2-hydroxy)-3-methoxyphenyl group, a 3-methoxy-4-(2-hydroxyethoxy)phenyl group, a chloromethoxyphenyl group, and a chloroethoxyphenyl group;

an alkylthio group-substituted phenyl group such as a methylthiophenyl group, an ethylthiophenyl group, a t-butylthiophenyl group, a di-tert-butylthiophenyl group, and a 2-methyl-1-methylthiophenyl group; and an alkylaminophenyl group such as an N,N-dimethylaminophenyl group, an N,N-diethylaminophenyl group, an N,N-dipropylaminophenyl group, an N,N-dibutylaminophenyl group, an N,N-diamylaminophenyl group, an N,N-dihexylaminophenyl group, an N-methyl-N-ethylaminophenyl group, an N-butyl-N-ethylaminophenyl group, an N-hexyl-N-ethylaminophenyl group, a 4-(N,N-dimethylamino)-ethylphenyl group, a 4-(N,N-diethylamino)-ethylphenyl group, a 3-(N,N-dimethylamino)-ethylphenyl group, and a 2-(N,N-dimethylamino)-ethylphenyl group.

Examples of the substituted naphthyl group include a halogenated naphthyl group such as a chloronaphthyl group, a dichloronaphthyl group, a trichloronaphthyl group, a bromonaphthyl group, a fluoronaphthyl group, a penta fluoronaphthyl group, and an iodinated naphthyl group; an alkyl derivative substituted naphthyl group such as an ethylnaphthyl group, a dimethylethylnaphthyl group, an iso-propylnaphthyl group a t-butylnaphthyl group, a t-butylmethylnaphthyl group, an octylnaphthyl group, a nonylnaphthyl group, and a trifluoromethylnaphthyl group; an alkoxy group-substitutednaphthyl group such asamethoxynaphthyl group, an ethoxynaphthyl group, a propoxynaphthyl group, a hexyloxynaphthyl group, a cyclohexyloxynaphthyl group, an octyloxynaphthyl group, a 2-ethylhexyloxynaphthyl group, a 3,5,5-trimethylhexyloxynaphthyl group, a methylethoxynaphthyl group, a dimethoynaphthyl group, a chloromethoxynaphthyl group, an ethoxyethoxynaphthyl group, and an ethoxyethoxyethoxynaphthyl group; an alkylthio group substituted naphthyl group such as a methylthionaphthyl group, an ethylthionaphthyl group, a t-butylthionaphthyl group, a methylethylthionaphthyl group, and a butylmethylthionaphthyl group; and an alkylaminonaphthyl group such as an N,N-dimethylaminonaphthyl group, an N,N-diethylaminonaphthyl group, an N,N-dipropylaminonaphthyl group, an N,N-dibutylaminonaphthyl group, an N,N-diamylaminonaphthyl group, an N,N-dihexylaminonaphthyl group, an N-methyl-N-ethylaminonaphthyl group, an N-butyl-N-ethylaminonaphthyl group, an N-hexyl-N-ethylaminonaphthyl group, a 4-(N,N-dimethylamino)-ethylnaphthyl group, a 4-(N,N-diethylamino)-ethylnaphthyl group, a 3-(N,N-dimethylamino)-ethylnaphthyl group, and a 2-(N,N-dimethylamino)-ethylnaphthyl group.

Examples of the substituted or unsubstituted aryl group include other than these, a substituted or unsubstituted p-nitrophenyl group, a substituted or unsubstituted pyridyl group, a substituted or unsubstituted pyrrolidyl group, a substituted or unsubstituted piperidyl group, a substituted or unsubstituted morpholine group, a substituted or unsubstituted tetra hydroptridyl group, a substituted or unsubstituted thiophenyl group, a substituted or unsubstituted imidazolyl group, and a substituted or unsubstituted furyl group.

The substituents represented by $R_{11}$ to $R_{14}$ of the dithiol metal complex compound represented by Formula (17) may be the same or different from each other, and particularly preferable examples thereof include a substituted or unsubstituted alkyl, phenyl or naphthyl group having 3 to 20 carbon atoms, such as an alkyl group, a phenyl group, a naphthyl group, a tolyl group, a xylyl group, a mesityl group, an ethylphenyl group, a dimethylphenyl group, an iso-propylphenyl group, a t-butylphenyl group, a t-butylmethylphenyl group, a methoxyphenyl group, an ethoxyphenyl group, a propoxyphenyl group, an N,N-dimethylaminophenyl group, a N,N-diethylaminophenyl group, an N, N-dibutylaminophenyl group, an ethylnaphthyl group, a dimethylethylnaphthyl group, an iso-propylnaphthyl group, a t-butylnaphthyl group, a t-butylmethylnaphthyl group, a methoxynaphthyl group, an ethoxynaphthyl group, a propoxynaphthyl group, a methylthionaphthyl group, an ethylthionaphthyl group, a t-butylthionaphthyl group, a methylethylthionaphthyl group, a butylmethylthionaphthyl group, an N,N-dimethylaminonaphthyl group, an N,N-diethylaminonaphthyl group, an N,N-dipropylaminonaphthyl group, and an N,N-dibutylaminonaphthyl group. Particularly preferable M is nickel.

These dithiol metal complex compounds represented by Formula (17) have characteristics such that an absorption maximum thereof exists in the near-infrared range of 800 to 900 nm and the absorption in the visible ray range is small. When the dithiol metal complex compound is combined with the diimmonium compound, the near-infrared range ray of 800 to 1000 nm is absorbed and shielded with good efficiency due to the multiplier effect of both, resulting in absorption of an unnecessary near-infrared ray emitted by a plasma display. Further, it is known that the heat resistance of the diimmonium compound remarkably decreases in the case of being mixed with other pigments in general. However, there is less chance that the heat resistance of decline in the heat resistance of the diimmonium compound when mixed with the dithiol metal complex compound. With respect to this point, using the both is preferable.

The amount of the dithiol metal complex compound added to the adhesive constituting the electromagnetic wave shielding light-transmitting member of the invention is determined by the near-infrared absorption power of the dithiol metal complex compound used, the film thickness of the adhesive, and the required absorption power. Assuming that the absorption power is constant, there is a necessity to add a large amount of the dithiol metal complex compound to the adhesive, and on the contrary, in the case that the film thickness of the near-infrared absorbing layer to be formed is thick, the amount of the dithiol metal complex compound added to the adhesive may be small. That is, the content of the dithiol metal complex compound in the adhesive and the film thickness of the near-infrared absorbing layer to be formed can be determined depending on the required near-infrared absorption power. For example, assuming that the absorption power is constant, it is necessary to add a large amount of the dithiol metal complex compound in the adhesive when the film thickness of the near-infrared absorbing layer to be formed is thin, and on the contrary, the amount of the dithiol metal complex compound added to the adhesive may be small when the film thickness of the near-infrared absorbing layer to be formed is thick. In other words, the content of the dithiol metal complex compound in the adhesive and the film thickness of the near-infrared absorbing layer to be formed can be determined depending on the required near-infrared absorption power.

The amount of the dithiol metal complex compound added is specifically preferably 1 to 1,000 mg, and more preferably 5 to 500 mg per unit area 1 $m^2$ of the near-infrared absorbing layer formed by the adhesive of the invention. For example, as for an amount compounded to the resin constituting the adhesive, the dithiol metal complex compound is preferably compounded in an amount of 0.05 to 10 parts by weight, and more preferably 0.2 to 5 parts by weight with respect to 100 parts by weight of the resin constituting the adhesive. When the amount of the dithiol metal complex compound is less than the aforementioned range, the film thickness of the near-infrared absorbing layer is preferably made to be considerably thicker in order to obtain the desired near-infrared absorption power. On the other hand, when the blended amount of the dithiol metal complex compound exceeds the range, transmittance of visible ray may decrease. For this reason, the film thickness of the near-infrared absorbing layer is preferably made to be considerably thinner.

Further, the compounding ratio of the diimmonium compound represented by Formula (1), the phthalocyanine compound represented by Formula (16), and the dithiol metal complex compound represented by Formula (17) is preferably set to 10:1:1 to 1:1:1 (weight ratio) respectively, because the ray of wavelength in the near-infrared region is absorbed with good efficiency.

The inclusion of the near-infrared ray absorbing substance in the adhesive constituting the electromagnetic wave shielding light transmitting member of the invention allows the electromagnetic wave shielding layer to have a function of shielding the electromagnetic wave and the near-infrared ray at the same time. With this, in the case of configuring a surface panel of a plasma display, for example, the near infrared absorbing layer provided as another layer can be omitted, which leads to making the display thinner. Furthermore, improvement in light resistance of the electromagnetic wave shielding member can also be achieved.

The adhesive of the electromagnetic wave shielding light-transmitting member of the invention preferably contains a color correction material. The color correction material is used for correcting a color balance of display colors of a display, and a pigment for color correction is normally used. Examples of the color correcting pigment include a pigment that cuts orange light with a wavelength of 580 to 610 nm emitted from neon etc. in a plasma display. Various pigments for color correction can be used depending on the use, and examples thereof include cyanine (polymethine), quinone, azo, indigo, polyene, Spiro, porphyrin, phthalocyanine, naphthalocyanine, and cyanine pigments, without being limited thereto. Further, cyanine, porphyrin, and pyrromethene pigments, etc. can be used for the purpose of cutting orange light with a wavelength of 580 to 610 nm emitted from neon etc. in a plasma display.

A compound having a ND filter function of neutral gray is also preferably compounded with the adhesive of the electromagnetic wave shielding light-transmitting member of the invention.

Figure 2:
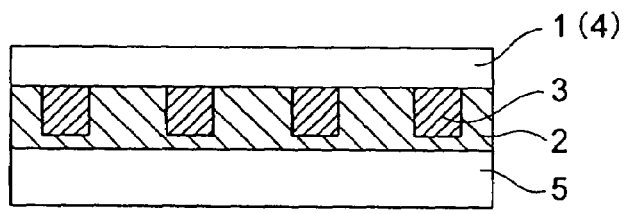
FIG. 2 is a sectional view of one example of an optical filter according to the invention.

Preferably, at least one of the release films in the electromagnetic wave shielding light-transmitting member of the invention is peeled off, so that the member may be pasted to a transparent base material 5 of the optical filter as shown in FIG. 2 to be used as an optical filter.

The transparent base material 5 imparts mechanical strength to the main body of the optical filter such as a plasma display besides the purpose of holding the electromagnetic wave shielding material. Because of this, the transparent base material is manufactured with a transparent material having high rigidity. Examples of the transparent material with high rigidity include a glass and a plastic material. Specifically, a tempered or semi-tempered glass, a polycarbonate material, and a polyacrylate material are preferably used. The thickness of the transparent base material is preferably 0.1 mm to 10 mm, and more preferably 2 mm to 5 mm in terms of the balance between strength and weight.

When the optical filter of the invention is applied to a plasma display for example, the optical filter preferably includes a layer having the electromagnetic wave shielding function and the optical function such as prevention of a break of a plasma display panel, cutting of near-infrared rays, and improvement in visibility. Further, the role of protecting the main body of the plasma display may be provided by imparting the mechanical strength. Specifically, the optical filter preferably has one or more functional layers selected from a hardcoatlayer, an antireflective layer, an antiglare functional layer, a color tone correcting layer, an ND filter layer, and a near-infrared ray absorbing layer. Besides, an antistatic layer and an ultra violet ray absorbing layer may be further formed in the optical filter. These layers can be stacked in an arbitrary order, and two or more of the same functional layers may be stacked.

The hard coat layer of the optical filter is to prevent scratches on the surface of a plasma display etc., and is preferably formed by an active energy ray curing type or thermal curing type resin. In the invention, the active energy ray (especially, ultra violet ray) curing type resin is preferably used considering the hardness of a coating film. The resin preferably comprises a coating agent containing various (meth)acrylates, a photopolymerization initiator, and if necessary, an organic solvent as main component, for example. Preferred examples of the various (meth)acrylates include (meth)acrylates such as polyurethane (meth)acrylate and epoxy (meth)acrylate, and other multi-functional (meth)acrylates.

The epoxy (meth)acrylate is one in which an epoxy group of an epoxy resin is esterified with (meth) acrylic acid and the functional group is changed to a (meth)acryloyl group.

Examples thereof include a (meth)acrylic acid adduct bisphenol A type epoxy resin and a (meth)acrylic acid adduct novolac type epoxy resin.

Urethane (meth)acrylate can be obtained, for example, by reacting (meth)acrylate having a hydroxyl group with an isocyanate group-containing urethane prepolymer, that is made by reacting polyol with polycyanate under a condition of excessive isocyanate group. Alternatively, the urethane (meth)acrylate may be obtained by reacting (meth)acrylate having an isocyanate group with a hydroxyl group-containing urethane prepolymer, that is made by reacting polyol with polycyanate under a condition of excessive hydroxyl group.

Examples of the polyol include ethylene glycol, propylene glycol, diethylene glycol, dipropylene glycol, butylene glycol, 1,6-hexanediol, 3-methyl-1,5-pentaneglycol, neopentylglycol, hexanetriol, trimethylolpropane, polytetramethylene glycol, and a polycondensate of adipic acid and ethylene glycol.

Examples of the polyisocyanate include tolylene diisocyanate, isophoron diisocyanate, and hexamethylene diisocyanate.

On the other hand, examples of the (meth)acrylate having a hydroxyl group include 2-hydroxyethylacrylate, 2-hydroxypropylacrylate, 4-hydroxybutylacrylate, pentaerythritoltriacrylate, and dipentaerythritolpentaacrylate.

Further, examples of (meth)acrylate having an isocyanate group include 2-methacryloyloxyethyl isocyanate and methacryloyl isocyanate.

Further, other multi-functional (meth)acrylates are those which have two or more (meth)acryloyl groups in a molecule, and preferred multi-functional (meth)acrylates are three or more acryloyl groups in a molecule. Specific examples of the other multi-functional (meth)acrylates include trimethylolpropanetriacrylate, ethyleneoxide modified trimethylolopropanetriacrylate, propyleneoxide modified trimethylolpropanetriacrylate, tris(acryloyloxyethyl)isocyanurate, caprolactone modified tris(acryloyloxyethyl)isocyanurate, pentaerythritoltriacrylate, pentaerythritoltetraacrylate, ditrimethylolpropanetetraacrylate, dipentaerythritoltetraacrylate, dipentaerythritolhexaacrylate, alkyl modified dipentaerythritoltriacrylate, alkyl modified dipentaerythritolpentaacrylate, caprolactone modified dipentaerythritolhexaacrylate, and a mixture of two or more kinds thereof.

Examples of the photopolymerization initiator used when the hard coat layer is formed include benzoinmethyl ether, benzomethyl ether, benzoinisopropyl ether, benzoinbutyl ether, diethoxyacetophenone, benzyldimethylketal, 2-hydroxy-2-methylpropiophenone, 1-hydroxycyclohexylphenyl ketone, benzophenone, 2,4,6-trimethylbenzoindiphenylphosphine oxide, Michler's ketone, N,N-dimethylamino isoamylbenzoate, 2-chlorothioxanthone, and 2,4-diethylthioxanthone. Two or more kinds of these photopolymerization initiators can be appropriately used in combination.

Examples of the organic solvent include aromatic hydrocarbons such as toluene and xylene; esters such as ethyl acetate, n-propyl acetate, iso-propyl acetate, n-butyl acetate, and iso-butyl acetate; alcohols such as methyl alcohol, ethyl alcohol, n-propyl alcohol, iso-propyl alcohol, and n-butyl alcohol; ketones such as acetone, methyl ethyl ketone, and methyl isobutyl ketone, and cyclohexanone; ethers such as 2-methoxyethanol, 2-ethoxyethanol, 2-butoxyethanol, ethylene glycoldimethylether, ethyleneglycoldiethylether, diethylene glycol dimethyl ether, and propylene glycol methyl ether; ether-esters such as 2-methoxyethyl acetate, 2-ethoxyethyl acetate, 2-butoxyethyl acetate, and propylene glycol methyl ether acetate. Two or more kinds of these organic solvents can be mixed and used.

Further, a colloidal metal oxide or silica sol using an organic solvent as a dispersion medium may be added to the coating agent used for forming the hard coat layer other than the above-described components in order to improve wear resistance.

The hard coat layer can be obtained by applying the coating liquid described above.

Available coating methods include a bar coating, a blade coating, a spin coating, a reverse coating, a die coating, a spray coating, a roll coating, a gravure coating, a lip coating, an air-knife coating, and a dipping method.

The hard coat layer is formed by applying the coating liquid, evaporating the solvent and crosslinking and curing the coating agent. The crosslinking and curing is performed by irradiation with an active energy ray such as an ultra violet ray and an electron beam if the coating agent is an active energy ray curing type. Examples of the active energy ray include ultra violet rays emitted from a light source such as a xenon lamp, a low-pressure mercury lamp, a high-pressure mercury lamp, an ultra high-pressure mercury lamp, a metal halide lamp, a carbon arc lamp, or a tungsten lamp, and an electron beam, $\alpha$ ray, $\beta$ ray, and $\gamma$ ray, etc. taken out normally from an electron beam accelerator of 20 to 2000 KeV. The thickness of the scratch preventing layer formed in this way is normally 1 µm to 50 µm, and preferably 3 µm to 20 µm.

The antireflection layer means a layer that imparts a function of preventing reflection or reducing reflection. The antireflection layer may be provided for the purpose of preventing surface reflection to increase visible light transmittance, and may be formed using any conventionally known method for forming an antireflection layer. An example of the antireflection layer forming method is the following general method. In the method, a thin low refractive index layer or multi-layered thin films with different refractive indexes each other are formed on one side or both sides of a support to reduce reflectivity by optical interference between the reflected light from the surface of the thin film and the refracted and reflected light at the interface. Specific examples of the layer configuration include a single low refractive index layer with a refractive index of 1.2 to 1.45, alternative combination of a high refractive index layer with a refractive index of 1.7 to 2.4 and a low refractive index layer, and combination of a medium refractive index layer with a refractive index of 1.5 to 1.9, a high refractive index layer with a refractive index of 1.7 to 2.4, and a low refractive index layer.

As the low refractive index layer described above, there may be used a metal compound such as $MgF_2$ (refractive index: about 1.4), $SiO_2$ (refractive index: about 1.2 to 1.5), and LiF (refractive index: about 1.4) and a composite metal compound such as $3NaF.AlF_3$ (refractive index: about 1.4) and $Na_3AlF_6$ (refractive index: about 1.33). Further, as the medium refractive index layer, there may be used a metal compound such as $Al_2O_3$ (refractive index: about 1.65) and MgO (refractive index: about 1.63) and a composite metal compound such as an Al—Zr composite oxide (refractive index: about 1.7 to 1.85). Furthermore, as the high refractive index layer, there may be used a metal compound such as $TiO_2$ (refractive index: about 2.3), $ZrO_2$ (refractive index: about 2.05), $Nb_2O_5$ (refractive index: about 2.25), $Ta_2O_5$ (refractive index: about 2.15), CeO (refractive index: about 2.15), $Sb_2O_5$, and a silver oxide subjected to an organic treatment, and a composite metal compound such as an In—Sn composite oxide (refractive index: about 1.7 to 1.85).

These optical layers can be formed using a known method such as a vacuum deposition method, a sputtering method, a chemical vapor deposition method (CVD method), a reactive sputtering method, an ion plating method, and an electroplating method.

The antireflection layer may be formed using a composition obtained by dispersing particles composed of the metal compound or composite metal compound in a matrix. For example, a composition obtained by dispersing low refractive fine particles such as $MgF_2$ and $SiO_2$ in an ultra violet ray curing or electron beam curing type resin or a matrix of silicon alkoxide may be used for the low refractive index layer. The low refractive fine particles are preferably porous because the ref ractive index becomes lower. A specific example of forming the low refractive index layer with the low refractive fine particles dispersed in a matrix is as follows. That is, the matrix including the low refractive fine particles is coated so that the film thickness becomes 0.01 to 1 μm, followed by conducting a drying process, an ultra violet ray irradiating process or an electron beam irradiating process depending on necessity. A known method can be used as the coating method, and available examples thereof include a method using a rod or a wire bar and various other coating methods such as a micro gravure, a gravure, a die coating, a curtain coating, a lip coating, and a slot coating method.

The antiglare functional layer decreases visual reflectivity by irregularly reflecting the external light to prevent glare. The antiglare functional layer is normally constituted with, for example, a layer containing a resin binder and fine particles. Examples of the fine particles used to constitute the antiglare functional layer include fine particles with a particle diameter of about 0.1 μm to about 10 μm such as silicon dioxide, an acrylic resin, an urethane resin, and a melamine resin. Further, an acrylic resin etc. can be used as the resin binder. The antiglare functional layer may be formed by application of a coating liquid containing a resin, fine particles, a solvent, etc., for example. The coating method may be any known method including a method using a rod or a wire bar, and various coating methods such as a micro-gravure coating method, a gravure coating method, a die coating method, a curtain coating method, a lip coating method, and a slot coating method. The antiglare functional layer can be also formed by performing an emboss process on a resin binder layer. The antiglare function can be also imparted by mixing the aforementioned fine particles in the hard coat layer or by performing the emboss process on the surface of the hard coat layer.

The color tone correcting layer described above is used to correct color balance of display colors, and an example thereof is a layer that cuts orange light with a wavelength 580 to 610 nm emitted from neon etc. in a plasma display. The color tone correcting layer contains a resin binder and/or a pigment for color correction.

Examples of the binder resin for use in the color tone correcting layer include resins such as an acrylic resin, a polyester resin, a polycarbonate resin, a polyurethane resin, a polyolefin resin, a polyimide resin, a polyamide resin, a polystyrene resin, a cycloolefin resin, a polyarylate resin, and polysulphone resin.

Various pigments can be used as the pigment for color correction depending on the usage, and examples thereof include pigments such as cyanine (polymethine), quinone, azo, indigo, polyene, spiro, porphyrin, phthalocyanine, naphthalocyanine, and cyanine, without being limited thereto. Cyanine pigment, porphyrin pigment, pyrromethene pigment, etc. can be used for the purpose of cutting orange light with a wavelength of 580 to 610 nm emitted from neon etc. in a plasma display.

The color tone correcting layer can be formed by application of a coating liquid including the aforementioned resin binder and/or the aforementioned pigment for color correction, etc. A known method can be used as the method of applying the coating liquid, and examples thereof include a method using a rod or a wire bar, various coating methods such as a micro-gravure coating method, a gravure coating method, die coating method, a curtain coating method, a lip coating method, and a slot coating method, a calendar coating method, and a cast coating method.

The pigment for color correction may be mixed into the hard coat layer, antiglare layer, antistatic layer, etc. for use. This provides these layers with the color correcting function. Alternatively, both the near-infrared ray absorbing agent and the ultra violet ray absorbing agent may be mixed in the color tone correcting layer.

The optical filter may be provided with a layer having an ND filter function of neutral gray. The ND filter layer may be any layer as long as it has transmittance of about 40 to 80%, and can be formed using a known method with known materials. In display devices using a fluorescent substance such as a plasma display, a CRT, a fluorescent display tube, and a field emission type display, a light is emitted from the fluorescent substance by irradiating the coated fluorescent substance with an electron beam or an ultra violet ray to make display with a transmitted light through a fluorescent screen or a reflected light from a fluorescent screen. Because the fluorescent substance is generally white and has high reflectivity, a large amount of the external light is reflected on the face of the fluorescent screen. For this reason, deterioration in display contrast due to reflection of the external light has conventionally become a problem in a display device using the fluorescent substance. This problem can de decreased by providing an ND filter layer.

The aforementioned near-infrared ray absorbing layer may be any layers which have a near-infrared ray absorbing function, a high transmittance in the wavelength region of 400 to 800 nm, and a low transmittance in the wavelength region of 800 to 1200 nm. As the near-infrared ray absorbing layer, available are, for example, a layer having near-infrared ray absorbing pigments mixed in a resin binder, and a near-infrared ray absorbing thin film such as an In—Sn composite oxide. Examples of such a near-infrared ray absorbing agent are a diimmonium type, a phthalocyanine type, a dithiol metal complex type, a cyanine type, a metal complex type, metal fine powder, and metal oxide fine powder, and a combination thereof including a resin can be made freely. However, as the near-infrared ray absorbing agent, there are preferably used the near-infrared ray absorbing agent described in detail as the near-infrared ray absorbing substance to be added to the adhesive constituting the electromagnetic wave shielding light-transmitting member in the previous paragraph in the present specification.

Examples of the binder resin for use in the near-infrared ray absorbing layer include resins such as an acrylic resin, a polyester resin, a polycarbonate resin, a polyurethane resin, a polyolefin resin, a polyimide resin, a polyamide resin, a polystyrene resin, a cycloolefin resin, a polyarylate resin, and a polysulphone resin.

The near infrared absorbing layer can be formed by application of a coating liquid containing the above-described materials. A known method can be used as the coating method, and examples thereof include a method using a rod or a wire bar, various coating methods such as micro-gravure coating method, a gravure coating method, a die coating method, a curtain coating method, a lip coating method, and slot coating method, a calendar coating method, and a cast coating method.

Further, the near-infrared ray absorbing agent may be mixed in the hard coat layer, antiglare layer, antistatic layer, etc. for use.

If necessary, an antistatic layer and an ultra violet ray absorbing layer may be provided. The antistatic layer and the ultra violet ray absorbing layer may be formed using the known antistatic agents, ultra violet absorbing agents, binder resins, etc. to be used so far to form an antistatic layer and an ultra violet ray absorbing layer, and using a known method. The antistatic agent and the ultra violet absorbing agent may be mixed into the hard coat layer, the antiglare layer, the color tone correcting layer, the ND filter layer, the near-infrared ray absorbing layer, etc. for use.

Optical filters include a directly-stuck optical filter pasted directly to a plasma display panel, etc. and an optical filter with a transparent base material, which is pasted to a transparent base material having a high rigidity to be located in the front face of a plasma display panel, etc. The electromagnetic wave shielding light-transmitting member of the invention is pasted to a directly stuck filter or transparent base material, which is provided with at least one of the aforementioned functional layers depending on necessity. By this, an optical filter with the electromagnetic shielding function is formed. The electromagnetic wave shielding light-transmitting member is pasted as described above. Specifically, one of the release films 1 and 4 of the electromagnetic wave shielding light-transmitting member is peeled off, and then the exposed adhesive layer is superimposed on a transparent base material having at least one of functional layers of the optical filter, followed by pressurizing. The electromagnetic wave shielding layer of the electromagnetic wave shielding light-transmitting member is preferably pasted to the optical filter so that it directly contacts to the transparent base material of the optical filter. However, it may be pasted on the face where the functional layer is provided. Further, the functional layer may be provided after the electromagnetic wave shielding layer is pasted to the optical filter base material.

The electromagnetic wave shielding light-transmitting member of the invention is also preferably used to form a display panel with electromagnetic wave shielding in such a manner that one release film thereon is peeled off and the exposed adhesive layer is directly pasted to a display panel such as a plasma display panel. The plasma display panel is a light-emitting unit that emits light using discharge phenomenon inside a plasma display member.

Furthermore, it is also preferred that one or more functional layers selected from a hard coat layer, an antireflection layer, an antiglare layer, a color tone correcting layer, and a near-infrared ray absorbing layer, etc. are formed on a display panel such as the plasma display panel with electromagnetic wave shielding of the invention. These functional layers may be formed on the electromagnetic wave shielding layer provided beforehand on the display panel using the electromagnetic wave shielding light-transmitting member of the invention. Alternatively, they are provided by pasting the optical filter, on which the aforementioned functional layers is provide, onto the electromagnetic wave shielding layer formed on the display panel according to the invention. Further, the functional layers may be laminated between the electromagnetic wave shielding layer and a display panel such as a plasma display panel.

So far, detailed description has been given to the electromagnetic wave shielding light-transmitting member, the optical filter, and the display panel such as a plasma display panel on which the electromagnetic wave shielding layer is formed using the electromagnetic wave shielding light-transmitting member of the invention. Now, a method for manufacturing the electromagnetic wave shielding light-transmitting member of the invention will be explained.

The method for manufacturing the electromagnetic wave shielding light-transmitting member of the invention is characterized by executing the following steps (1) to (7) in an arbitrary order and performing active energy ray irradiation at least one time:

(1) a step of pasting a metal foil and a base material film through an adhesive of active energy ray adhesive force vanishing type;

(2) a step of forming a metal mesh by selectively etching the metal foil;

(3) a step of conducting a blackening treatment on the surface of the metal foil or metal mesh;

(4) a step of pasting a metal mesh face of a laminated body including the base material film, the adhesive of active energy ray adhesive force vanishing type, and the metal mesh (herein after a laminated body including a base material film, an adhesive of active energy ray adhesive force vanishing type, and the metal mesh is referred to as 'a adhesive sheet with mesh'.) to a support for transfer through an adhesive;

(5) a step of peeling off the base material film from the metal mesh;

(6) either step of (6a) or (6b) described below;

(6a) a step of pasting an exposed part of the metal mesh generated by peeling off the base material film from the metal mesh to a new release film; or (6b) a step of pasting an exposed part of the metal mesh generated by peeling off the base material film from the metal mesh, to an adhesive face of a laminated body obtained by applying an adhesive on a new release film; and (7) a step of burying the metal mesh into the adhesive.

In the invention, the steps described above may be performed in an arbitrary order, and in general, the steps (1), (2), (4), (5), (6), and (7) are performed in this order. The blackening treatment for the metal foil in the step (3) is normally conducted between the steps (1) and (2), and the blackening treatment for the metal mesh in the step (3) is normally conducted between the steps (2) and (4).

In the method for manufacturing the electromagnetic wave shielding light-transmitting member of the invention, irradiation with an active energy ray is performed at least one time. The irradiation with an active energy ray includes at least irradiation to weaken the adhesive force of the active energy ray adhesive force vanishing type adhesive located between the metal foil and the base material film to thereby release the metal mesh from the base material film. In addition, the irradiation includes irradiation with the active energy ray from the base material film side of a mesh forming sheet, which includes the base material film, the adhesive of active energy ray adhesive force vanishing type, and the metal foil. The adhesive of active energy ray adhesive force vanishing type may be irradiated with the active energy ray at any time after the metal foil is pasted to the base material film until the mesh is peeled off, and the number of times of the irradiation may be arbitrary. The irradiation with the active energy ray may be performed at the same time with the treatment of each step, or it may be performed as a different step from each step. That is, the irradiation with the active energy ray may be performed at an appropriate stage of the step and at a step before, after or at the same time with the pasting of the transfer sheet, and the irradiation may be performed several times.

It is essential that the irradiation with the active energy ray is performed from the base material film side, and additionally, the irradiation may be also performed from the mesh side.

Examples of the active energy ray for use in the invention include an electromagnetic wave such as an electron beam, an ultra violet ray, and a radiation ray, and the ultra violet ray is preferred in the invention. The irradiation with the ultra violet ray can be performed using a known light source such as a metal halide lamp, a high pressure mercury lamp, an electrodeless lamp, a xenone lamp, a semiconductor laser, an Ar laser, a pulse UV lamp, and a light-emitting diode lamp.

The irradiation with the active energy ray in the invention can be performed one time or more thanonetime. The integrated amount of irradiation is not particularly limited as long as it is an irradiation amount which enables reduction of the adhesive force of the active energy ray adhesive force vanishing type adhesive. In the case of the ultra violet ray, the irradiation amount is preferably 20 to 3,000 $mJ/cm^2$, and more preferably 50 to 2,000 $mJ/cm^2$. When the irradiation amount is less than 20 $mJ/cm^2$, it is normally difficult to vanish the adhesive force of the active energy ray adhesive force vanishing type adhesive, and when it exceeds 3,000 $mJ/cm^2$, the irradiation is economically disadvantageous.

Hereinafter, each step will be explained further with reference to FIGS. 3 to 7.

The step (1) is specifically a step of producing a mesh forming sheet obtained by pasting a metal foil and a base material film through an adhesive of active energy ray adhesive force vanishing type.

Figure 3:
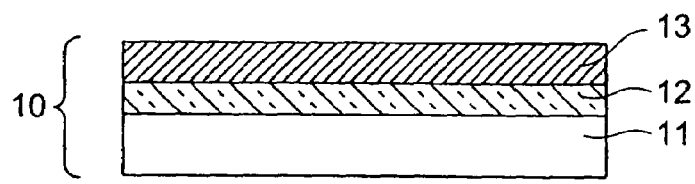
FIG. 3 is a sectional view of a mesh forming sheet.

A mesh forming sheet 10 is composed of a laminated body in which a base material film 11, an adhesive of active energy ray adhesive force vanishing type 12, and a metal foil 13 are laminated, for example, as shown in FIG. 3. The base material film 11 used to produce the mesh forming sheet 10 is used as a support when a geometric shaped metal mesh, that is an electromagnetic wave shielding material of an electromagnetic wave shielding light-transmitting member, is formed from a metal foil by chemical etching. The base material film 11 may be flexible or nonflexible. The base material film is removed anyway in the step of forming the electromagnetic wave shielding light-transmitting member. For this reason, any material may be used as long as it has no problem of disturbing the etching by being dissolved into an etchant when the metal foil is chemically etched and it transmits the active energy ray, and a plastic material is preferable. Specific examples of the plastic material include resins exemplified as the resins constituting the release film in the explanation of the release film constituting the electromagnetic wave shielding light-transmitting member. A PET film is preferred from the view point of the cost and handling.

The adhesive of active energy ray adhesive force vanishing type 12 in the step (1) is an adhesive which is irradiated with an active energy ray to decrease its adhesive force. The adhesive is used to bond the metal foil to the base material film by superimposing the metal foil 13 on the adhesive of active energy ray adhesive force vanishing type 12 formed on the base material film 11, followed by pressurizing. As the adhesive of active energy ray adhesive force vanishing type 12, there are used preferably adhesives comprising an elastic polymer having a reactive functional group, an active energy ray reactive compound, a photopolymerization initiator and a curing agent. Further, a tackifying resin (for example, rosin ester), an inorganic fine particle compound (for example, a silica compound with an average particle diameter of 20 μm or less), a polymerization inhibitor (for example, hydroquinone), an antirust agent, a plasticizer, an ultra-violet ray absorbing agent, etc., that are known additive agents, may be compounded with the adhesive of active energy ray adhesive force vanishing type 12.

Preferable examples of the elastic polymer having a reactive functional group, that constitutes the adhesive of active energy ray adhesive force vanishing type, include an acrylic polymer and an urethane polymer. Examples of the reactive functional group include a carboxyl group, a hydroxyl group, an amide group, a glycidyl group, and an isocyanate group.

Available examples of the acrylic polymer include (C) a copolymer of a monomer having a reactive functional group and another (meth)acrylic ester monomer and (D) a copolymer of a monomer having a reactive functional group, another (meth) acrylic ester monomer, and another vinyl monomer that is copolymerizable with the aforementioned monomers. These acrylic polymers can be synthesized by a known method. The glass transition point of the acrylic polymer is preferably 10° C. or less in order to impart adhesiveness. The weight average molecular weight (measured using a calibration curve of standard polystyrenes by gel permeation chromatography, herein after same as above.) is preferably 200,000 to 2,000,000, and more preferably 400,000 to 1,600,000 in terms of the balance between adhesive force and cohesive force.

Examples of the monomer having a reactive functional group used to constitute the copolymer include acrylic acid, methacrylic acid, itaconic acid, 2-hydroxyethyl acrylate, 2-hydroxyethyl methacrylate, 4-hydroxybutyl acrylate, acrylamide, glycidyl methacrylate, and 2-methacryloyloxyethyl isocyanate.

Further, examples of the another (meth)acrylic ester monomer include methyl acrylate, methyl methacrylate, ethyl acrylate, ethyl methacrylate, butyl acrylate, butyl methacrylate, isobutyl acrylate, isobutyl methacrylate, isopropyl acrylate, 2-ethylhexyl acrylate, 2-ethylhexyl methacrylate, lauryl acrylate, dimethylaminomethyl methacrylate, and dimethylaminoethyl methacrylate.

Examples of the another vinyl monomer that is copolymerizable with the (meth) acrylic ester monomer include vinyl acetate, styrene, α-methylstyrene, acrylonitrile, and vinyltoluene.

On the other hand, examples of the urethane polymer used in a second adhesive or pressure-sensitive adhesive include a polymer obtained by causing organic polyisocyanate to react with polyurethane polyol having a terminal hydroxyl group obtained by reaction of a polyol and an organic polyisocyanate.

Examples of the polyol for use in production of the urethane polymer described above include known polyester polyols and polyether polyols. Examples of an acid component of polyester polyol include terephthalic acid, adipic acid, and azelaic acid, examples of a glycol component thereof include ethylene glycol, propylene glycol, and diethylene glycol, and examples of a polyol component thereof include glycerin, trimethylolpropane, and pentaerythritol. Examples of polyetherpolyol include polyetherpolyols having two or more functional groups such as polypropylene glycol, polyethylene glycol, and polytetramethylene glycol. The weight average molecular weights of polyesterpolyol and polyetherpolyol are preferably 1,000 to 5,000, and more preferably 2,500 to 3,500. When the weight average molecular weights of polyesterpolyol and polyetherpolyol are less than 1,000, the reaction is fast so that gelation is easily caused, and when it is more than 5,000, reactivity decreases and cohesive force also decreases. When polyol and organic polyisocyanate are reacted, polyvalent amines may be used together.

Examples of the organic polyisocyanate include known aromaticpolyisocyanate, aliphaticpolyisocyanate, araliphatic polyisocyanate, and alicyclic polyisocyanate. Examples of the aromatic polyisocyanate include 1,3-phenylene diisocyanate, 4,4-diphenyldiisocyanate, 2,4-tolylene diisocyanate, 2,6-tolylene diisocyanate, and 4,4-diphenylmethane diisocyanate. Examples of the aliphaticpolyisocyanate include trimethylene diisocyanate, tetramethylene diisocyanate, and hexamethylene diisocyanate. Examples of the araliphatic polyisocyanate include ω,ω'-diisocyanate-1,3-dimethylbenzene, ω,ω'-diisocyanate-1,4-dimethylbenzene, and ω,ω'-diisocyanate-1,4-diethylbenzene. Examples of the alicyclic polyisocyanate include isophorone diisocyanate, 1,3-cyclopentane diisocyanate, and 1,4-cyclohexane diisocyanate. A trimethylolpropane adduct of the aforementioned organic polyisocyanate, a buret compound of the organic polyisocyanate reacted with water, and a trimer of the organic polyisocyanate having an isocyanurate ring, etc. may be used together with the organic polyisocyanate.

The weight average molecular weight of the urethane polymer is preferably 5,000 to 300,000, and more preferably 10,000 to 200,000 in terms of the balance between adhesive force and cohesive force.

Further, examples of the active energy ray reactive compound constituting the adhesive of active energy ray adhesive force vanishing type include monomers and oligomers that are three-dimensionally crosslinked by the active energy ray irradiation. It is preferable that they have two or more acryloyl groups or methacryloyl groups in the molecule. The amount of the active energy ray reactive compound used is preferably 20 to 500 parts by weight, and more preferably 40 to 300 parts by weight with respect to 100 parts by weight of the acrylic polymer or urethane polymer. When it is less than 20 parts by weight, decrease of the adhesive force after the active energy ray irradiation may be insufficient, and when it exceeds 500 parts by weight, contamination due to a non-reacted part may occur.

Examples of the monomer that is three-dimensionally crosslinked by the active energy ray irradiation include 1,6-hexanediol diacrylate, trimethylolpropane triacrylate, trimethylolpropane trimethacrylate, and dipentaerythrithol hexaacrylate. However, the compound to be used as the monomer that is three-dimensionally crosslinked by the active energy ray irradiation in the invention is not limited to these, and any known monomers can be used that are three-dimensionally crosslinked by the active energy ray irradiation.

Preferable examples of the oligomer that is three-dimensionally crosslinked by the active energy ray irradiation include an urethane acrylate oligomer. As the urethane acrylate oligomer, there may be used oligomers obtained by reaction of a prepolymer with terminal isocyanates and acrylates or methacrylates having a hydroxyl group such as 2-hydroxyethyl acrylate, 2-hydroxyethyl methacrylate, polyethylene glycol acrylate, polyethylene glycol methacrylate, and pentaerythritol triacrylate. As the aforementioned prepolymer with terminal isocyanates, there are exemplified reaction products obtained by reaction of polyol such as ethylene glycol, propylene glycol, and 1,6-hexanediol with organic polyisocyanate such as 2,4-tolylene diisocyanate, 2,6-tolylene diisocyanate, 1,3-xylylene diisocyanate, 1,4-xylylene diisocyanate, and diphenylmethane 4,4-diisocyanate, and modified substance or polymer thereof. Further, another example is, without being limited to, an oligomer obtained with a method of increasing a terminal hydroxyl group by reaction of the prepolymer with terminal isocyanate with 3 to 4 functional hydroxyl group-containing compounds such as trimethylolpropane and pentaerythritol, and then allowing to react with acrylate ormethacrylatehaving a hydroxyl group. Anyurethaneoligomers synthesized by a conventional method can be used. The weight average molecular weight of the urethane acrylate oligomer is preferably 500 to 30,000, and more preferably 600 to 20,000. The urethane acrylate oligomer has preferably 2 to 15 acryloyl or methacryloyl groups, more preferably 4 to 15 acryloyl or methacryloyl groups, and particularly preferably 6 to 15 acryloyl or methacryloyl groups.

Examples of the photopolymerization initiator include benzophenone, acetophenone, benzoin, benzoin methyl ether, benzoin ethyl ether, benzoin isopropyl ether, benzoin isobutyl ether, benzoin benzoic acid, benzoin methylbenzoate, benzoin dimethylketal, acetophenone dimethylketal, 2,4-diethyloxanson, 1-hydroxycyclohexylphenyl ketone, benzyldiphenylsulfide, azobisisobutylonitrile, benzyl, dibenzyl, diacetyl, bisimidazole, and β-chloranthraquinone, but not limited thereto. Any of known photopolymerization initiators can be used in the invention.

A high molecular weight photopolymerization initiator may be preferably used to impart dissolution resistance against liquid chemicals such as an etchant and an alkaline solution to the photopolymerization initiator. The high molecular weight photopolymerization initiator preferably has a weight average molecular weight of 1,000 to 2,000,000, more preferably 3,000 to 2,000,000, furthermore preferably 5,000 to 2,000,000, and particularly preferably 10,000 to 2,000,000. The high molecular weight photopolymerization initiator having a weight average molecular weight of 1,000 to 2,000,000 is not eluted into the liquid chemical because of a large molecular weight. When the weight average molecular weight thereof is less than 1,000, there is a fear of elution of the photopolymerization initiator into the liquid chemical, and when it exceeds 2,000,000, the synthesis is difficult from the aspect of viscosity.

The photopolymerization initiator with high molecular weight is one which is high molecular weighted by such a method as, for example, bonding the photopolymerization initiator having a reactive functional group to oligomer or polymer through reaction with a function group capable of reacting with the aforementioned reactive functional group, or polymerizing a monomer in which the photopolymerization initiator having a reactive functional group is bound to oligomer or polymer through the aforementioned functional group capable of reacting with the reactive functional group.

Examples of the reactive functional group in the photopolymerization initiator having a reactive functional group include a hydroxyl group and a carboxyl group. Examples of the photopolymerization initiator having a hydroxyl group include 1-(4-(2-hydroxyethoxy)phenyl)-2-hydroxy-2-methyl-1-propane-1-on and 2-hydroxy-2-methyl-1-phenyl-propne-1-on. Examples of the photopolymerization initiator having a reactive functional group include benzophenone-2-carboxylic acid. Among the photopolymerization initiators having a reactive functional group, 1-(4-(2-hydroxyethoxy) phenyl)-2-hydroxy-2-methyl-1-propane-1-on is preferable.

An example of the method for synthesizing the high molecular weighted photopolymerization initiator is a method of increasing the molecular weight in multiple stages in such a manner that, for example, a hydroxyl group of the photopolymerization initiator having the hydroxyl group is allowed to react with two acid anhydride rings of a polybasic acid anhydride (for example, pyromellitic dianhydride) and two remaining carboxyl groups are allowed to react with glycidyl groups in both ends of bisphenol A. Further, another example is a method of incorporating a photopolymerization initiator into a polymer main chain in the following manner. That is, a photopolymerization initiator having two hydroxyl groups or two carboxyl groups may be used. The two hydroxyl groups are allowed to react with bifunctional organic acid (for example, adipic acid), or alternatively, the two carboxyl groups are caused to react with bifunctional polyol (for example, ethylene glycol) to synthesize polyester.

Further, examples of other synthesis methods include: a method of synthesizing a high molecular weighted photopolymerization initiator by allowing a hydroxyl group of the photopolymerization initiator having the hydroxyl group to react in advance with an isocyanate group of a compound having a carbon-carbon double bond and the isocyanate group (for example, 2-methacryloyloxyisocyanate) to synthesize a photopolymerization initiator-containing monomer, followed by copolymerization of the monomer synthesized with another monomer; a method of allowing an acid anhydride ring of an acid anhydride having a carbon-carbon double bond (for example, maleic anhydride, itaconic anhydride, etc.) to react with a photopolymerization initiator having a hydroxyl group, followed by copolymerization with another monomer; and a method of allowing a compound having a carbon-carbon double bond and a carboxyl group (for example, acrylic acid, methacrylic acid, etc.) to react with a photopolymerization initiator having a hydroxyl group, followed by copolymerization with another monomer.

As the high molecular weighted photopolymerization initiator, there is preferably exemplified one made by reaction of the photopolymerization initiator having a reactive functional group and a high molecular weight compound having a weight average molecular weight of 3,000 to 2,000,000 and having a functional group capable of reacting with the reactive functional group, that is, by grafting the photopolymerization initiator to a high molecular weight compound. This is because there is less elution of photopolymerization initiator into liquid chemicals such as an etchant.

Examples of the method of grafting the photopolymerization initiator to a high molecular weight compound include, without being limited to, a method of allowing one of isocyanate groups in isophorone diisocyanate to react with a photopolymerization initiator having a hydroxyl group, followed by reaction of the other isocyanate group with a hydroxyl group on the high molecular weight compound; a method of allowing a photopolymerization initiator having a hydroxyl group to react with an isocyanate group on the high molecular weight compound; a method of allowing a photopolymerization initiator having a hydroxyl group to react with an acid anhydride ring on the high molecular weight compound; a method of allowing a photopolymerization initiator having a carboxyl group to react with a glycidyl group on the high molecular weight compound; and a method of allowing a photopolymerization initiator having a carboxyl group to react with a hydroxyl group on the high molecular weight compound.

The weight average molecular weight of the high molecular weight compound grafting the photopolymerization initiator is preferably 3,000 to 2,000,000, and the high molecular weight compound is preferably an acrylic polymer or urethane polymer. The weight average molecular weight of the acrylic polymer is preferably 3,000 to 2,000,000. When the weight average molecular weight is less than 3,000, control of the molecular weight at synthesis is difficult, and when it exceeds 2,000,000, the synthesis is difficult from the aspect of viscosity. The weight average molecular weight of the urethane polymer is preferably 2,000 to 200,000. When the weight average molecular weight is less than 2,000, control of the molecular weight at synthesis is difficult, and when it exceeds 200,000, the synthesis is difficult from the aspect of viscosity.

In the adhesive of active energy ray adhesive force vanishing type in the invention, the photopolymerization initiator and a sensitizer are preferably used in combination. Examples of the sensitizer include triethanolamine, N-methyldiethanolamine, N,N-dimethylethanolamine, and N-methylmorpholine, but not particularly limited thereto, and any known sensitizer can be used.

The curing agent reacts with an acrylic polymer having a reactive functional group to thereby impart a cohesive force to the adhesive. As the curing agent, known multi-functional compounds can be used such as an isocyanate compound, an epoxy compound, and an aziridinyl compound having reactivity with a reactive functional group. The amount of the curing agent used may be determined by considering the types and the adhesive force of the acrylic monomer. Without being particularly limited, the curing agent is added at preferably 0.1 to 15 parts by weight, and more preferably 0.1 to 10 parts by weight with respect to 100 parts by weight of the acrylic resin. The amount of less than 0.1 parts by weight is not preferable because the degree of crosslinking decreases and the cohesive force becomes insufficient, and that exceeding 15 parts by weight is not preferable because the adhesive force to the adherend tends to be small.

Examples of the isocyanate compound include diisocyanate such as tolylene diisocyanate, isophorone diisocyanate, hexamethylene diisocyanate, m-phenylene diisocyanate, and xylylene diisocyanate, a trimethylolpropane adduct of these, a buret compound of these which is formed by reaction with water, and a trimer of these which has an isocyanurate ring.

Examples of the epoxy compound include sorbital polyglycidyl ether, polyglycerol polyglycidyl ether, pentaerythritol polyglycidyl ether, diglycerol polyglycidyl ether, glycerol polyglycidyl ether, neopentyl glycol diglycidyl ether, resorcine diglycidyl ether, metaxylene diamine tetraglycidyl ether, and their hydrogenated products.

Examples of the aziridinyl compound include N,N'-diphenylmethane-4,4-bis(1-aziridine carboxyamide), trimethylolpropane-tri-β-aziridinyl propionate, tetramethylolmethane-tri-β-aziridinyl propionate, and N,N'-toluene-2,4-bis(1-aziridine carboxyamide)triethylene melamine.

Figure 4:
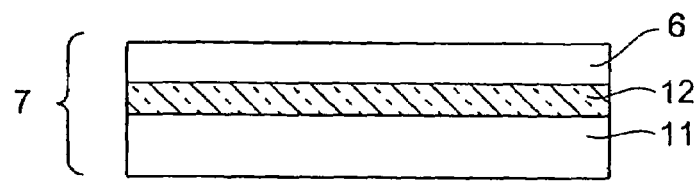
FIG. 4 is a sectional view of a laminated body including a base material film, an adhesive of active energy ray adhesive force vanishing type, and a release film.

The mesh forming sheet 10 may be manufactured by, for example, a method in which a laminated body 7 (containing no electromagnetic wave shielding material, herein after referred to as adhesive sheet) including a base material film 11, an adhesive of active energy ray adhesive force vanishing type 12, and a release film 6 as shown in FIG. 4 is produced, the release film 6 is peeled from the adhesive sheet 7, and the surface of the active energy ray adhesive force vanishing type adhesive layer and the metal foil are superimposed to paste the metal foil. In this method, the metal foil is pasted to the adhesive layer after producing the adhesive sheet 7. Thus, the pasting with the metal foil is performed after the crosslinking of the curing agent for use in the adhesive of active energy ray adhesive force vanishing type is finished.

Examples of the method of producing the adhesive sheet 7 include two methods below.

The first method is a method of directly applying an adhesive of active energy ray adhesive force vanishing type on a base material film to paste a release film onto the base material film.

The second method is a method of applying an adhesive of active energy ray adhesive force vanishing type on a release film to paste the release film onto a base material film.

In addition to the above-described methods, an example of the method for manufacturing the mesh forming sheet 10 is a method of applying the adhesive of active energy ray adhesive force vanishing type 12 on one side of the base material film 11 and pasting the metal foil 13 thereon (a metal foil laminating method at coating). In this metal foil laminating method at coating, a release film is not used and the metal foil is pasted right after the crosslinking of the curing agent for use in the adhesive of active energy ray adhesive force vanishing type is started. Therefore, fluidability of the adhesive is high and adhesiveness with the metal foil is much higher compared with the above-described method. Because of this, in the mesh forming step with a micro-lithography method, peeling of the metal foil hardly occurs that may occur when the liquid chemical such as an etchant and resist stripping liquid invades the interface between the adhesive and the metal foil. Since laminating of the release film 6 in the post-process becomes unnecessary in the metal foil laminating method at coating, it is possible to lower cost by simplifying the process and to lower cost by not using the release film.

The metal foil laminating method at coating may be performed by means of a laminated flat plate press method using one kind of or two or more kinds of the conditions such as heating, pressurizing, and vacuum depending on necessity in order to obtain sufficient adhesiveness between the metal foil and the adhesive layer.

Examples of the method of applying the adhesive of active energy ray adhesive force vanishing type include, without being limited to, a comma coating method, a curtain coating method, a blade coating method, a gravure coating method, a kiss coating method, a reverse coating method, and a micro-gravure coating method.

The thickness of the adhesive of active energy ray adhesive force vanishing type is preferably about 0.5 μm to about 50 μm. When the thickness of the adhesive is less than 0.5 μm, sufficient adhesiveness cannot be obtained, and when it exceeds 50 μm, it is economically disadvantageous.

Figure 5:
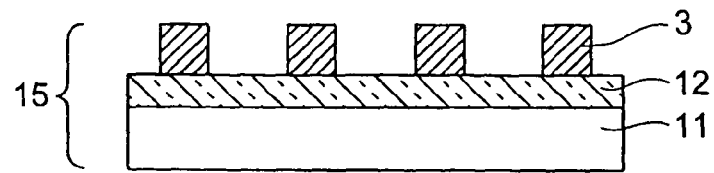
FIG. 5 is a sectional view of a mesh forming sheet having formed therein a metal mesh that is an electromagnetic wave shielding material.

In the above-described step (2), specifically, a metal mesh that is the electromagnetic wave shielding material is formed on the metal foil by a photolithography method, etc., followed by stripping of a resist and neutralization. The method of forming a mesh of a geometric shape or the like on the metal foil of the metal mesh forming sheet is as described above. The mesh forming sheet 15 in which the metal mesh obtained in this step is shown in FIG. 5. In FIG. 5, reference numeral 11 denotes a base material film, 12 denotes an adhesive of active energy ray adhesive force vanishing type, and 3 denotes a metal mesh that is the electromagnetic wave shielding material.

The step (3) is a step of applying a blackening treatment on the metal foil or metal mesh. The blackening treatment may be performed using a blackening treatment liquid with a known method employed in the field of printed circuit boards. In the step (3), the top face of the metal foil or the top and side faces of the metal mesh can be blackened. In the case of using a copper foil as the metal foil, the blackening treatment can be conducted in a solution such as aqueous sodium chlorite (31 g/liter), aqueous sodium hydroxide (15 g/liter), and aqueous trisodium phosphate (12 g/liter) at 95° C. for 2 minutes, for example. However, when the metal foil blackened is used in advance, the step (3) after the step (2) may be omitted because the step (3) is performed before the step (1).

Figure 6:
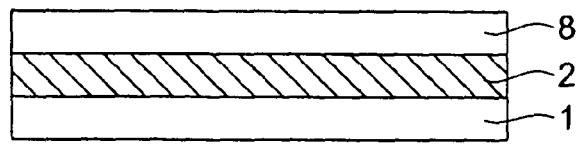
FIG. 6 is a sectional view of an adhesive sheet.

In the step (4), one release film of two release films 1 and 8 pasted together through the adhesive 2 (herein after, referred to as transfer sheet) is peeled off and pasted with the metal mesh face of the mesh forming sheet. The transfer sheet is shown in FIG. 6. A transfer sheet 9 is produced by applying an adhesive on the release film 1 and then pasting a new release film 8 on the face of the adhesive 2. A known method can be used as the method of applying the adhesive 2 on the release film 1 similarly to the method of applying the adhesive of active energy ray adhesive force vanishing type. The adhesive is an adhesive explained in the electromagnetic wave shielding light-transmitting member. As described above, an available examples thereof is an adhesive of active energy ray curing type that contains an acrylic polymer having at least one kind of reactive functional groups of a carboxyl group, a hydroxyl group, an amide group, a glycidyl group, and an amino group in a molecule and a curing agent that is capable of reacting with the reactive functional group.

The transfer sheet 9 and the mesh forming sheet 15 having the metal mesh formed therein are pasted together by peeling off one release film 8 of the transfer sheet and then pasting an exposed adhesive face to the mesh of the mesh forming sheet 15. Moreover, a laminator is preferably used for the pasting.

Figure 7:
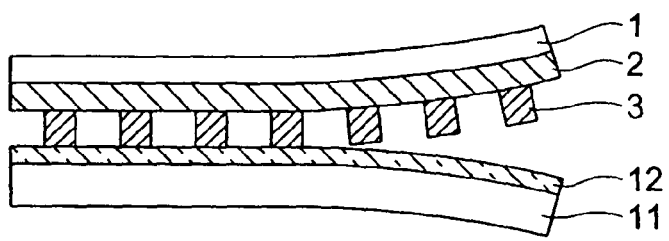
FIG. 7 is a view showing a process of peeling off the metal mesh from the mesh forming sheet.

The step (5) is a step of peeling off the base material film from the metal mesh. The process of peeling off the metal mesh 3 is shown in FIG. 7. The active energy ray is emitted from the base material film side before the releasing step, so that an adhesive force of the adhesive of active energy ray adhesive force vanishing type 12 is decreased. This irradiation with the active energy ray may be performed before or after the transfer sheet is pasted to the metal mesh. If the adhesive force of the adhesive of active energy ray adhesive force vanishing type is sufficiently decreased by the active energy ray irradiation, the base material film 11 and the adhesive of active energy ray adhesive force vanishing type 12 can be easily peeled off from the electromagnetic wave shielding material 3 formed from the metal mesh. The metal mesh 3 peeled off is kept on the adhesive layer of the transfer sheet. When the metal mesh is peeled off, the base material film is peeled off on the basis of a conductive frame part provided on an outer periphery of the geometric shape of the metal mesh.

The step (6) comprises a step (6a) of pasting a release face obtained by peeling off the base material film from the metal mesh with a new release film, or a step (6b) of pasting a release face obtained by peeling off the base material film from the metal mesh with an adhesive face of a laminated body formed by applying an adhesive on a new release film. A mesh forming sheet in which the new release film and the metal mesh are pasted together in the step (6a) is shown in FIG. 8a. A mesh forming sheet in which the adhesive face of the laminated body formed by applying an adhesive on a new release film and the metal mesh are pasted together in the step (6b) is shown in FIG. 9a. This allows a state in which the metal mesh 3, that is the electromagnetic wave shielding material, is sandwiched between two release films 1 and 21.

Hereinafter, a method of pasting a release face obtained by peeling off the base material film from the metal mesh with a new release film, followed by burying the metal mesh in the adhesive layer is referred to as a one-layer burying method, and a method of pasting a release face obtained by releasing the base material film from the metal mesh with an adhesive face of a laminated body formed by applying an adhesive on a new release film, followed by burying the metal mesh in the adhesive layer is referred to as a two-layer burying method. The laminated body formed by applying an adhesive on a new release film in the two-layer burying method may be prepared by applying the adhesive on the release film or may be prepared by peeling off one release film of the transfer sheet. Note that the arbitrary pasting method described above can be used in the pasting in the one-layer burying method and in the two-layer burying method. Examples thereof include a method by heating and pressurizing, a roll pressurizing method, a flat plate pressing method, and a method using a laminator.

The step (7) is a step of burying the metal mesh existed between two release films in the adhesive. The method of burying the mesh in the adhesive includes methods described in the one-layer burying method and two-layer burying method. Controlling the heating temperature and applied pressure, the step (7) and step (6) may be performed simultaneously. The embodiment of the one-layer burying method is shown in FIG. 8, and the embodiment of the two-layer burying method is shown in FIG. 9.

Figure 8:
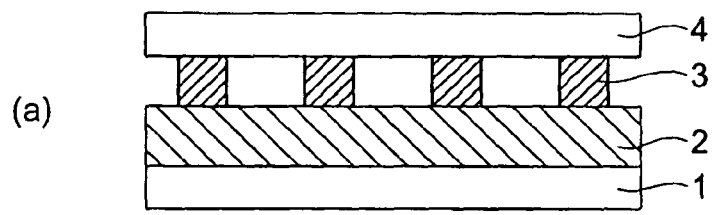
FIGS. 8(a) and 8(b) are views showing a step of pasting a transfer sheet having the metal mesh carried on an adhesive layer with a release sheet, and pressurizing to bury the metal mesh into the adhesive layer.
Figure 8:
Figure 8:
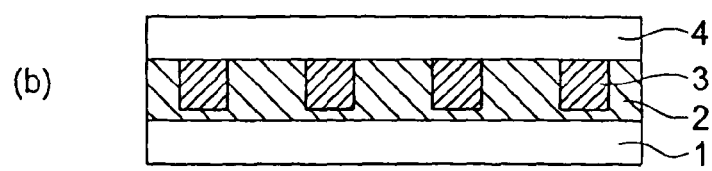
Figure 9:
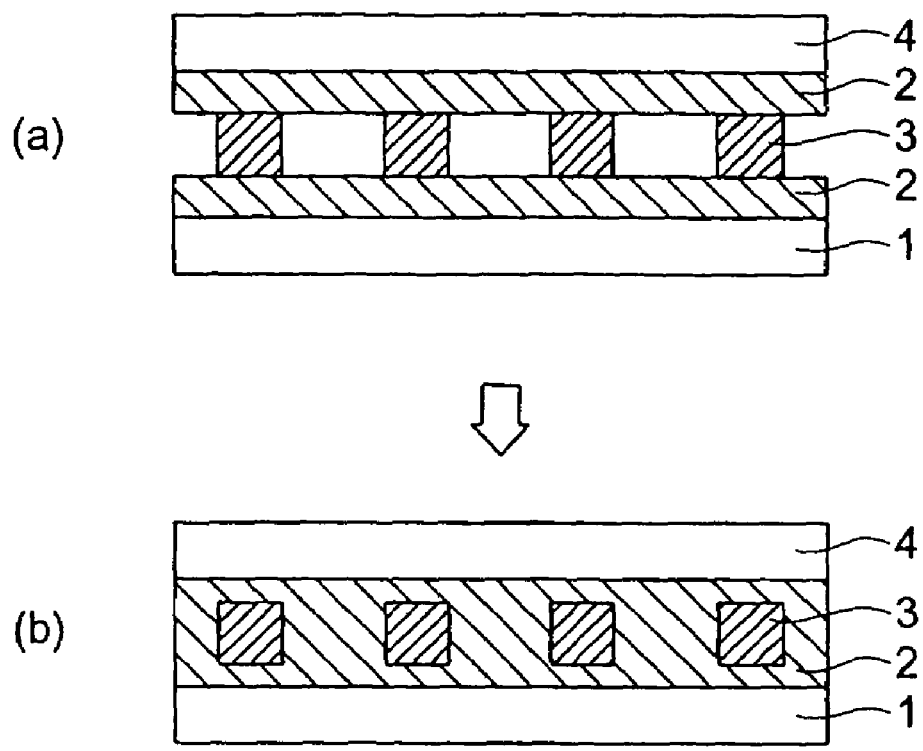
FIGS. 9(a) and 9(b) are views showing a step of pasting an adhesive face of the laminated body obtained by applying the adhesive on the release film, with the transfer sheet having the metal mesh carried on the adhesive layer, and pressurizing to bury the metal mesh into the adhesive layer.

In the one-layer burying method shown in FIG. 8, the new release film 4 is pasted to the metal mesh face of the transfer sheet having the mesh 3 transferred thereto (FIG. 8(a)), and the resultant is heated and pressurized with a laminator to bury the mesh 3 in the adhesive 2 of the transfer sheet (FIG. 8(b)). The condition when burying the mesh is preferably under heating because of the necessity of allowing the adhesive to flow into the mesh, and the heating temperature is, for example, preferably 20 to 150° C., more preferably 40 to 130° C., and further more preferably 60° C. to 120° C. When the heating temperature is less than 20° C., the flowability of the adhesive is poor, and when it exceeds 150° C., there is a fear of spoiling the quality of the adhesive and dripping due to excess flowing. The applied pressure is preferably 1 to 50 kg/cm$^2$, more preferably 1 to 30 kg/cm$^2$, and further more preferably 1 to 20 kg/cm$^2$. When the applied pressure is less than 1 kg/cm$^2$, flowability of the adhesive is poor, and when it exceeds 50 kg/cm$_2$, the mesh may be deformed. The states of FIGS. 1(a) to 1(c) can be selected by adjusting the heating and pressurizing conditions, the film thickness of the adhesive layer, and the like.

For the burying of the mesh, the mesh 3 may be buried completely into the adhesive layer 2 (refer to FIG. 1(d) and FIG. 8(b)), or alternatively, the face of the mesh 3 in th side of the new release film may be exposed from the adhesive layer 2 (refer to FIGS. 1(a), 1(b) and 1(c)). It is preferable that the thickness of the adhesive layer 2 of the transfer sheet to be used is thicker than the thickness of the mesh 3. Because the thickness of the metal foil used for forming the mesh is 0.5 to 40 μm, the adhesive layer 2 may be applied and formed at a thickness of preferably 1 to 300 μm, more preferably 5 to 200 μm, and further more preferably 5 to 100 μm. When the thickness is less than 5 μm, burying property is poor, and when it exceeds 300 μm, it is economically disadvantageous.

In the two-layer burying method, the adhesive face of the new adhesive sheet obtained by forming the adhesive layer 2 on the release film 4 is pasted to the face of the metal mesh 3 on the transfer sheet, which is formed by transfer of the mesh thereto (FIG. 9(a)). In this case it is preferable that the mesh 3 is pasted and buried by heating and pressurizing with a laminator at the same time (FIG. 9(b)). For the thickness of the adhesive of the transfer sheet used in this method, the total thickness of the adhesive layer 2 of the transfer sheet and the adhesive layer 2 of the new adhesive sheet is preferably thicker than the thickness of the mesh. The total thickness is preferably 1 to 300 μm, more preferably 5 to 200 μm, and further more preferably 5 to 100 μm. In this method, the mesh is completely buried into the adhesive. In the two-layer burying method, the adhesives constituting the adhesive layer having the carried metal mesh and the adhesive layer of the new adhesive sheet may be the same or different.

As another method, there is exemplified a method that after conducting the one-layer burying method, a second release film 4 is peeled off and then an adhesive face of a third adhesive sheet formed by applying the adhesive on the release film is pasted thereon. According to this method, the metal mesh that is the electromagnetic shielding material is buried further into the adhesive.

Different adhesives can be used depending on whether the one-layer burying method or the two-layer burying method is performed. In the one-layer burying method, an active energy ray curing type adhesive may be preferably used. In the two-layer burying method, the above-described arbitrary adhesive is preferably used as the adhesive applied to the first-layer release film, and an active energy ray curing type adhesive is preferably used as the adhesive of the second release film.

The covered state of the electromagnetic shielding material with the adhesive differs depending on the degree of burying of the electromagnetic shielding layer in the step (7). That is, a state in which the electromagnetic shielding material is covered with the adhesive and a state in which a part of the electromagnetic shielding material is exposed from the adhesive are formed. The effect of the invention can be achieved in both states.

As explained above, the electromagnetic wave shielding light-transmitting member of the invention can be manufactured with the steps (1) to (7). The manufactured electromagnetic wave shielding light-transmitting member contains the adhesive and the electromagnetic wave shielding material between two release films.

The electromagnetic wave shielding light-transmitting member of the invention is preferably used for an electromagnetic wave shield of a display, particularly, a plasma display. Preferably, one face of the electromagnetic wave shielding light-transmitting member is pasted to the transparent base material or the plasma display panel, while the other face is pasted to a film having a hard coat layer, a near-infrared ray absorbing layer, etc. formed thereon. The member is also preferably pasted to a film in which the hard coat layer, etc. is formed in place of the transparent material, etc.

EXAMPLES

Hereinafter, the present invention will be specifically explained based on examples, but not limited thereto. Moreover, "%" and "parts" in examples and comparative examples means "% by weight" and "parts by weight" respectively, unless otherwise noted. Further, the weight average molecular weight is a polystyrene calibrated value measured by GPC (gel permeation chromatography).

Production Example 1 for Adhesive Sheet with Mesh

A raw material containing 85.3 parts by weight of butyl acrylate, 15 parts of methyl acrylate, 4 parts of acrylic acid, 0.7 part of 2-hydroxyethyl acrylate, 0.03 part of azobisisobutylonitrile, 190 parts of acetone, and 110 parts of toluene was used and reacted in a nitrogen atmosphere under heating and refluxing for 8 hours, to obtain a solution (nonvolatile content of 25% by weight) of an acrylic polymer (weight average molecular weight of 1,100,000) having a reactive functional group. Into 100 parts of this synthesized elastic polymer solution having a reactive functional group, 0.7 part of an adduct body of tolylene diisocyanate (a curing agent "Sumidule L-75" manufactured by Sumika-Bayer Urethane Co., Ltd.), 0.75 part of 2-methyl-1-((4-methylthio)phenyl)-2-Morphorino-propane-1-on (a photopolymerization initiator "Iruga Cure 907" manufactured by Ciba Specialty Chemicals), and 15 parts of a hexa-functional urethane acrylate oligomer ("Ebecryl 1290K" manufactured by Daicel-UCS Co., Ltd., weight average molecular weight of 1,000) were compounded to obtain an adhesive of active energy ray adhesive force vanishing type.

Next, a polyester polyurethane anchor coating agent ("AD-335AE" manufactured by Toyo-Morton, Ltd.) was applied on one face of a 100 µm-thick PET film for base material ("A-5000" manufactured by Toyobo Co., Ltd.) at a thickness (dry film thickness) of 0.2 µm. The above-described adhesive of active energy ray adhesive force vanishing type was applied on top of the PET film so that the thickness after drying became 10 µm, and a release film ("E7002" (25 µm thickness) manufactured by Toyobo Co., Ltd.; herein after this film is used as a release film.) was pasted thereon to obtain an adhesive sheet. The obtained adhesive sheet was subjected to aging in a 40° C. atmosphere for 3 days.

After the aging, the release film was peeled off and a 10 µm-thick electrolytic copper foil (NS-VLP manufactured by Mitsui Mining & Smelting Co., Ltd.) was laminated on the adhesive face of the adhesive sheet with a laminator at a temperature of 80° C., a pressure of 0.4 MPa/cm$^2$, and a pasting speed of 0.8 m/min, to obtain a copper foil laminated body (mesh forming sheet).

A mesh with a line width of 12 µm and a line pitch of 300 µm was formed on the copper foil laminated body by a photolithography method using chemical etching (pasting of resist film→exposure→development→chemical etching→stripping of resist film→neutralization), and then the copper surface was subjected to a blackening treatment to obtain an adhesive sheet with mesh.

Production Example 2 for Adhesive Sheet with Mesh

The adhesive of active energy ray adhesive force vanishing type produced in Production Example 1 for Adhesive Sheet with Mesh was applied on an easy adhesive face of a 50 µm-thick PET film for base material ("A-4100" manufactured by Toyobo Co., Ltd.) so that the thickness after drying became 10 µm, and then the same steps as those in Production Example 1 for Adhesive Sheet with Mesh were performed to obtain an adhesive sheet.

The release film of the thus obtained adhesive sheet was peeled off, and a 10 µm-thick electrolytic copper foil (NS-VLP manufactured by Mitsui Mining & Smelting Co., Ltd.) was laminated onto the adhesive face of the adhesive sheet with a laminator at a temperature of 23° C. and a pressure of 0.05 MPa/cm$^2$, to obtain a copper foil laminated body. The obtained copper laminated body was subjected to aging in a 40° C. atmosphere for 3 days.

A mesh with a line width of 10 µm and a line pitch of 300 µm was formed on the copper foil laminated body by a photolithography method using chemical etching, and then, the laminated body was subjected to the same blackening treatment as in Production Example 1 for Adhesive Sheet with Mesh, to obtain an adhesive sheet with mesh.

Production Example 3 for Adhesive Sheet with Mesh

A raw material containing 88 parts of methyl methacrylate, 9 parts of ethyl acrylate, 3 parts of acrylamide, 0.44 part of azobisisobutylonitrile, and 260 parts of toluene was used and reacted by heating and refluxing in a nitrogen atmosphere for 3 hours, followed by reprecipitation with methanol to obtain a polymer. The polymer was filtered and dried under reduced pressure to obtain an adhesive composition with a weight average molecular weight of 700,000. 450 parts of toluene and 10 parts of ethyl acetate were compounded with 100 parts of the obtained adhesive composition to obtain an adhesive solution. The adhesive solution was applied to a 100 µm-thick PET film for base material ("A-4300" manufactured by Toyobo Co., Ltd.) so that the thickness after drying became 20 µm, and a 10 µm-thick electrolysis copper foil (NS-VLP) was laminated on the adhesive face with a laminator at a temperature of 180° C. and a pressure of 0.4 MPa/cm$^2$, to obtain a copper foil laminated body.

A mesh with a line width of 10 µm and a line pitch of 300 µm was formed on the copper foil laminated body by a photolithography method using chemical etching, and then, the laminated body was subjected to the same blackening treatment as in Production Example 1 for Adhesive Sheet with Mesh to obtain an adhesive sheet with mesh.

Production Example 1 for Transfer Sheet

A raw material containing 90 parts of butyl acrylate, 10 parts of methyl acrylate, 5 parts of 2-hydroxyethylmethacrylate, 0.04 part of azobisisobutylonitrile, and 186 parts of ethyl acetate was used and reacted by heating and refluxing in a nitrogen atmosphere for 7 hours, to obtain a solution (nonvolatile content of 35% by weight) of an acrylic polymer (weight average molecular weight of 550,000) having a reactive functional group.

0.9 part of "Sumidule L-75" was compounded with 100 parts of the obtained solution of an acrylic polymer having a reactive functional group, the compounded solution was applied on the release film so that the thickness after drying became 18 µm, and a new release film was pasted on the adhesive layer to obtain a transfer sheet.

Production Example 2 for Transfer Sheet

A transfer sheet was prepared in the same manner as in Production Example 1 for Transfer Sheet, except the application was performed so that the thickness of the compounded solution on the transfer sheet after drying became 10 µm.

Production Example 3 for Transfer Sheet

A transfer sheet was prepared in the same manner as in Production Example 1 for transfer sheet, except the application was performed so that the thickness of the compounded solution on the transfer sheet after drying became 40 µm.

Production Example 4 for Transfer Sheet

A raw material containing 79 parts of butyl acrylate, 20 parts of methyl acrylate, 1.0 part of 2-hydroxyethyl acrylate, 0.02 part of azobisisobutylonitrile, 190 parts of acetone, and 210 parts of toluene was used and reacted by heating and refluxing in a nitrogen atmosphere for 8 hours, to obtain a solution (nonvolatile content of 20% by weight) of an acrylic polymer with a weight average molecular weight of 1,500,000.

With 100 parts of the obtained acrylic polymer solution, compounded were 1 part of trimethylolpropane trimethacrylate (an active energy ray reactive compound "LIGHT-ESTER TMP" manufactured by Kyoeisha Chemical Co., Ltd.), 0.05 part of 1-hydroxy-cyclohexyl-phenyl-ketone (a photopolymerization initiator "Iruga Cure 184" manufactured by Ciba Specialty Chemicals), and 0.001 part of hydroquinone (a polymerization inhibitor manufactured by Seiko Chemical Co., Ltd.). The solution was applied on the release film so that the thickness after drying became 16 µm, and a new release film was pasted on the adhesive layer to obtain a transfer sheet using an active energy ray curing type adhesive.

Production Example 5 for Transfer Sheet

A transfer sheet was prepared in the same manner as in Production Example 1 for Transfer Sheet, except the release film was applied with an active energy ray curing type adhesive obtained by compounding 0.9 part of "Sumidule L-75", 1.0 part of a diimmonium compound ("K-1032" manufactured by Nippon Kayaku Co., Ltd.) as a near infrared absorbing substance, and 0.5 part of a phthalocyanine compound ("EX COLOR IR-14" manufactured by Nippon Kayaku Co., Ltd.) into 100 parts of the solution (nonvolatile content of 35% by weight) of an acrylic polymer having a reactive functional group synthesized in Production Example 1 for Transfer Sheet.

Production Example 6 for Transfer Sheet

A transfer sheet is prepared in the same manner as in Production Example 4 for Transfer Sheet, except the release film was applied with an adhesive obtained by blending 1 part of "LIGHT-ESTER TMP", 0.05 part of "Iruga Cure 184", 0.001 part of hydroquinone, 1.0 part of a diimmonium compound having sulfonamide as an anionic component ("CIR-RL" manufactured by Japan Carlit Co., Ltd.) as a near infrared absorbing substance, and 0.5 part of a phthalocyanine compound ("EX COLOR IR-14" manufactured by Nippon Kayaku Co., Ltd.) into 100 parts of the solution (nonvolatile content of 35%) of an acrylic polymer having a reactive functional group synthesized in Production Example 4 for Transfer Sheet.

Example 1

One of the release films of the transfer sheet produced in Production Example 1 for Transfer Sheet was peeled off, and was pasted to the metal mesh side of the adhesive sheet thereof with mesh produced in Production Example 1 for Adhesive Sheet with Mesh. The resultant laminated body was irradiated from the side of the adhesive sheet with mesh with ultra violet rays of an integrated light quantity of 700 mJ/cm$^2$ using a 120 W/cm metal halide lamp in order to vanish the adhesive force of the adhesive of active energy ray adhesive force vanishing type, and then, the adhesive sheet was peeled off. This allowed the metal mesh to be transferred on the adhesive layer of the transfer sheet. Then, the release film was pasted to the mesh on the transfer sheet and pressed at a temperature of 80° C. and a pressure of 5 kg/cm$^2$ using a laminator to bury the mesh into the adhesive layer of the transfer sheet, thereby producing an electromagnetic wave shielding light-transmitting member. Furthermore, one of the release films of the electromagnetic wave shielding light-transmitting member was peeled off and a semi-tempered glass of 2.5 mm in thickness was pasted on the member to produce an electromagnetic wave shielding light-transmitting member with a transparent base material.

Example 2

One of the release films of the transfer sheet produced in Production Example 1 for Transfer Sheet was peeled off, and it was pasted to the metal mesh side of the adhesive sheet with mesh produced in Production Example 1 for Adhesive Sheet with Mesh. The resultant laminated body was irradiated from the side of the adhesive sheet with mesh thereof with ultra violet rays of an integrated light quantity of 700 mJ/cm$^2$ using a 120 W metal halide lamp in order to vanish the adhesive force of the adhesive of active energy ray adhesive force vanishing type, and then, the adhesive sheet was peeled off. This allowed the mesh to be transferred on the adhesive layer of the transfer sheet. The adhesive layer obtained by peeling off one of the release films of the transfer sheet produced in Production Example 3 for Transfer Sheet was pressed on the mesh on the transfer sheet at a temperature of 80° C. and a pressure of 5 kg/cm$^2$ using a laminator to bury the mesh into the adhesive layer of the transfer sheet, thereby producing an electromagnetic wave shielding light-transmitting member. Further, one of the release films of the electromagnetic wave shielding light-transmitting member was peeled off, and a semi-tempered glass of 2.5 mm in thickness was pasted to the member to produce an electromagnetic wave shielding light-transmitting member with a transparent base material.

Example 3

The adhesive sheet with mesh produced in Production Example 2 for Adhesive Sheet with Mesh was irradiated from the side of the PET film for base material thereof with ultra violet rays of an integrated light quantity of 700 mJ/cm using a 120 W metal halide lamp, to vanish the adhesive force of the adhesive of active energy ray adhesive force vanishing type. One of the release films of the transfer sheet produced in Production Example 4 for Transfer Sheet was peeled off and pasted to the mesh, and then, the adhesive sheet was peeled off. This allowed the mesh to be transferred on the adhesive layer of the transfer sheet. Then, the release film was pasted to the mesh on the transfer sheet and pressed at a temperature of 80° C. and a pressure of 5 kg/cm$^2$ using a laminator to bury the mesh into the transfer sheet. Subsequently, the transfer sheet was irradiated with ultra violet rays of an integrated light quantity of 400 mJ/cm$^2$ using a 120 W metal halide lamp to cure the active energy ray curing type adhesive, thereby imparting a cohesive force. Thus, an electromagnetic wave shielding light-transmitting member was produced. Further, one of the release films of the electromagnetic wave shielding light-transmitting member was peeled off and a semi-tempered glass of 2.5 mm in thickness was pasted thereto, to produce an electromagnetic wave shielding light-transmitting member with a transparent base material.

Example 4

An electromagnetic wave shielding light-transmitting member and an electromagnetic wave shielding light-transmitting member with a transparent base material were prepared in the same manner as in Example 1, except that the transfer sheet produced in Production Example 5 for Transfer Sheet was used in place of the transfer sheet produced in Production Example 1 for Transfer Sheet used in Example 1.

Example 5

An electromagnetic wave shielding light-transmitting member and an electromagnetic wave shielding light-transmitting member with a transparent base material were prepared in the same manner as in Example 3, except that the transfer sheet produced in Production Example 6 for Transfer Sheet was used in place of the transfer sheet used in Example 3, which is the transfer sheet produced in Production Example 4 for Transfer Sheet.

Example 6

One of the two release films in the electromagnetic wave shielding light-transmitting member in Example 3 was peeled off and the member was pasted with a plasma display panel to obtain a plasma display panel with an electromagnetic wave shield.

Comparative Example 1

One of the two release films in the transfer sheet produced in Production Example 1 for Transfer Sheet was peeled off to paste the sheet to the face of PET film for base material of the adhesive sheet with mesh produced in Production Example 3 for Adhesive Sheet with Mesh. Subsequently, one release film in a new transfer sheet produced in Production Example 1 for Transfer Sheet was peeled off, the adhesive layer of the transfer sheet was pasted to the mesh side, and the mesh was buried into the adhesive layer at a temperature of 80° C. and a pressure of 5 kg/cm$^2$ using a laminator, to produce an electromagnetic wave shielding light-transmitting member. Furthermore, the release film in the side of the PET film in the transfer sheet (the transfer sheet produced in Production Example 1 for Transfer Sheet) was peeled off and a semi-tempered glass of 2.5 mm in thickness was pasted thereto, to produce an electromagnetic wave shielding light-transmitting member with a transparent base material.
(Test of Characteristics)

Measured were the adhesive force, the electromagnetic wave shielding property, the visible light transmittance, and the yield of the electromagnetic wave shielding light-transmitting member obtained as above, and the thickness of the electromagnetic wave shielding light-transmitting member with a transparent base material. The measurement results are shown in Table 1.

[Adhesive Force]

The adhesive force was measured with a method prescribed with JIS Z 0237 (width 25 mm, peel angle 180°, and peel rate 300 mm/min) using a tensile testing machine ("TE-503" manufactured by Tester Sangyo Co., Ltd.) and an acrylic plate of 3 mm in thickness ("COMOGLASS" manufactured by Kuraray Co., Ltd.) as an adherend. Additionally in Comparative Example 1, a value after thermal press onto the adherend is made to be the adhesive force because the adhesive is used therein.

[Electromagnetic Wave Shielding Property]

The electromagnetic wave shielding properties in the frequency range of 100 MHz to 1 GHz within the frequency range of 10 MHz to 1 GHz were measured using a spectrum analyzer ("MS2601B" manufactured by Advantest Corporation), a standard signal generator ("MG3602A" manufactured by Advantest Corporation), and a jig for measurement ("MA8602B" manufactured by Anritsu Corporation). The values at 100 MHz and 1 GHz were recorded as typical values.

[Visible Light Transmittance]

The average value of transmittance in the range of 400 nm to 700 nm was measured using a spectrophotometer ("V-570" manufactured by JASCO Cooperation).

[Yield of Electromagnetic Wave Shielding Member]

The yield rate was investigated by manufacturing 100 sheets of electromagnetic wave shielding members of 42-inch size.

(A) The Number of the Discarded Members Due to Scratching of the Base Material Film:

The surface of the PET film for base material was observed visually after manufacturing the electromagnetic wave shielding light-transmitting member. The members deemed to have scratched due to roll feeding in the manufacturing line were discarded because they could not be used for a display. The disposal due to scratching of the electromagnetic wave shielding light-transmitting member manufactured using the adhesive of active energy ray adhesive force vanishing type was zero, because even in the case that the PET film for base material was scratched when the mesh was formed the PET film was peeled off afterward.

(B) The Number of the Discarded Members Due to the Attachment of Foreign Matters to the Mesh Opening:

After manufacturing the electromagnetic wave shielding member, all attachments of foreign matters on a part to be etched (an opening) besides the mesh part were observed with a magnifying glass of 10×, and when one or more foreign matters were found in the opening of the electromagnetic wave shielding light-transmitting member, the member was discarded because it could not be used for a display. Additionally the disposal of the electromagnetic wave shielding light-transmitting member manufactured using the adhesive of active energy ray adhesive force vanishing type was zero, because even in the case that the foreign matters were confirmed in the opening the adhesive of active energy ray adhesive force vanishing type was peeled off after formation of the mesh, so that no foreign matters remained.

From the total number of the discarded members in (A) and (B) above, the yield rate to 100 sheets of the manufactured electromagnetic wave shielding members was calculated.

[Thickness of Electromagnetic Wave Shielding Light-Transmitting Member with Transparent Base Material]

The thickness of the electromagnetic wave shielding light-transmitting member pasted to a semi-reinforced glass plate was measured for every release film with a caliper, and the thickness obtained by subtracting the release film was recorded. However, Example 6 cannot be simply compared with other examples because the member was directly pasted to a plasma display panel. Therefore, Example 6 is omitted.

TABLE 1

| Unit | Adhesive force g/25 mm | Electromagnetic wave shielding property 100 MHz dB | Electromagnetic wave shielding property 1 GHz dB | Visible light transmittance % | Number of the discarded members due to scratching of the base material film sheet | Number of the discarded members due to the attachment of foreign matters sheet | Yield of electromagnetic wave shielding member % | Thickness of electromagnetic wave shielding light-transmitting member with transparent base material μm |
|---|---|---|---|---|---|---|---|---|
| Example 1 | 820 | 43 | 45 | 85 | 0 | 0 | 99 | 18 |
| Example 2 | 1,300 | 43 | 45 | 80 | 0 | 0 | 99 | 50 |
| Example 3 | 1,100 | 44 | 45 | 82 | 0 | 0 | 99 | 16 |
| Example 4 | 750 | 43 | 46 | 82 | 0 | 0 | 99 | 18 |

TABLE 1-continued

| Unit | Adhesive force g/25 mm | Electromagnetic wave shielding property | | Visible light transmittance % | Number of the discarded members due to scratching of the base material film sheet | Number of the discarded members due to the attachment of foreign matters sheet | Yield of electromagnetic wave shielding member % | Thickness of electromagnetic wave shielding light-transmitting member with transparent base material μm |
|---|---|---|---|---|---|---|---|---|
| | | 100 MHz dB | 1 GHz dB | | | | | |
| Example 5 | 950 | 44 | 45 | 83 | 0 | 0 | 99 | 16 |
| Example 6 | 500 | 43 | 46 | 80 | 0 | 0 | 99 | — |
| Comparative Example 1 | 2,800 | 42 | 46 | 63 | 5 | 10 | 85 | 156 |

As shown in Table 1, the electromagnetic wave shielding light-transmitting member in Comparative Example 1 produced from the adhesive sheet with mesh produced in Production Example 3 for Adhesive Sheet shows low transparency due to deterioration of the visible light transmittance by the scratching of the PET film for base material and the attachment of the foreign matters to the mesh opening part. The yield rate is also decreased due to the above factors.

On the other hand, the electromagnetic wave shielding light-transmitting member with the configuration of the invention has not only a high visible light transmittance, but also a high yield rate because there is no scratching of the PET film for base material, nor is there attachment of foreign matters to the mesh opening at manufacturing. This is because prevention of scratching of the electromagnetic wave shield and prevention of attachment of foreign matters to the mesh opening are made to be compatible since the adhesive and the electromagnetic wave shielding layer are properly contained between two release films.

An electromagnetic shield that is superior in transparency can be obtained with the electromagnetic wave shielding light-transmitting member of the invention. Furthermore, the electromagnetic wave shielding light-transmitting member of the invention can contribute to making a plasma display thin because no base material film is used.

The invention claimed is:

1. A method for manufacturing an electromagnetic wave shielding light-transmitting member, in which steps (1) to (7) described below are conducted in an arbitrary order and irradiation with an active energy ray is performed at least one time:
   (1) a step of pasting a metal foil and a base material film through a first adhesive of active energy ray adhesive force vanishing type;
   (2) a step of forming a metal mesh by selectively etching the metal foil;
   (3) a step of conducting a blackening treatment on the surface of the metal foil or metal mesh;
   (4) a step of pasting the metal mesh face of a laminated body including the base material film, the adhesive of active energy ray adhesive force vanishing type, and the metal mesh to a support for transfer through a second adhesive;
   (5) a step of peeling off the base material film from the metal mesh;
   (6) a step of pasting an exposed part of the metal mesh generated by peeling off the base material film from the metal mesh to a new release film; and
   (7) a step of burying the metal mesh into the second adhesive,
   wherein irradiation with an active ray is performed at any time after the metal foil is pasted to the base material film until the mesh is peeled off, from the base material side.

2. A method for manufacturing an electromagnetic wave shielding light-transmitting member, in which steps (1) to (7) described below are performed in an arbitrary order and irradiation with an active energy ray is performed at least one time:
   (1) a step of pasting a metal foil and a base material film through a first adhesive of active energy ray adhesive force vanishing type;
   (2) a step of forming a metal mesh by selectively etching the metal foil;
   (3) a step of conducting a blackening treatment on the surface of the metal foil or metal mesh;
   (4) a step of pasting the metal mesh face of a laminated body including the base material film, the adhesive of active energy ray adhesive force vanishing type, and the metal mesh to a support for transfer through a second adhesive;
   (5) a step of peeling off the base material film from the metal mesh;
   (6) a step of pasting an exposed part of the metal mesh generated by peeling off the base material film from the metal mesh to the adhesive face of a new laminated body obtained by applying a third adhesive on a release film; and
   (7) a step of burying the metal mesh into the second and third adhesives,
   wherein irradiation with an active ray is performed at any time after the metal foil is pasted to the base material film until the mesh is peeled off, from the base material side.

* * * * *